(12) United States Patent
Kosugi et al.

(10) Patent No.: US 8,174,237 B2
(45) Date of Patent: May 8, 2012

(54) BATTERY MODULE

(75) Inventors: Shinichiro Kosugi, Kanagawa (JP); Nobuo Shibuya, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1131 days.

(21) Appl. No.: 11/994,144

(22) PCT Filed: Jul. 7, 2006

(86) PCT No.: PCT/JP2006/313547
§ 371 (c)(1),
(2), (4) Date: Dec. 28, 2007

(87) PCT Pub. No.: WO2007/007655
PCT Pub. Date: Jan. 18, 2007

(65) Prior Publication Data
US 2009/0208821 A1    Aug. 20, 2009

(30) Foreign Application Priority Data

Jul. 7, 2005  (JP) ................................ 2005-199129

(51) Int. Cl.
*H02J 7/00* (2006.01)
(52) U.S. Cl. ........ 320/116; 320/118; 320/119; 320/130; 320/134; 324/426
(58) Field of Classification Search .................. 320/116, 320/118, 119, 130, 134; 324/426
See application file for complete search history.

(56) References Cited

U.S. PATENT DOCUMENTS 6,762,588 B2 * 7/2004 Miyazaki et al. ............. 320/116
2010/0124693 A1  5/2010 Kosugi et al.

FOREIGN PATENT DOCUMENTS

| JP | 11 160367 | 6/1999 |
|---|---|---|
| JP | 2001 204141 | 7/2001 |

(Continued)

OTHER PUBLICATIONS

U.S. Appl. No. 12/050,595, filed Mar. 18, 2008, Tatebayashi, et al.

(Continued)

*Primary Examiner* — Edward Tso
*Assistant Examiner* — Samuel Berhanu
(74) *Attorney, Agent, or Firm* — Oblon, Spivak, McClelland, Maier & Neustadt, L.L.P.

(57) ABSTRACT

In a battery system, battery modules (3a, 3b) connected to each other in series respectively include: one or more single cells (3a1 to 3an, 3b1 to 3b-n) connected to one another in any one of series, parallel, and series-parallel; cell voltage switches (7a, 7b) for detecting voltages respectively of the one or more single cells; module monitoring control units (9a, 9b) each for monitoring the detected voltages respectively of the one or more signal cells; and communications level converter circuits (14a, 14b). The battery system includes a master unit (8a) for receiving information on the voltages respectively of the one or more single cells from the module monitoring control units via the communications level converter circuits. One of the communications level converter circuits includes a switch element (Q32) for transmitting a signal of a low-potential battery module to a high-potential battery module. A series circuit includes resistors R1', R2' and $R^5$ as well as the switch element is connected between a positive electrode of the highest-potential single cell in the high potential battery module and a negative electrode of the lowest-potential single cell in the low-potential battery cell.

4 Claims, 14 Drawing Sheets

FOREIGN PATENT DOCUMENTS

| | | |
|---|---|---|
| JP | 2001 307782 | 11/2001 |
| JP | 2001-307782 A | 11/2001 |
| JP | 2001307782 A * | 11/2001 |
| JP | 2002 139523 | 5/2002 |
| JP | 2003 70179 | 3/2003 |
| JP | 2004 187398 | 7/2004 |
| JP | 2005 117780 | 4/2005 |

OTHER PUBLICATIONS

Japanese Office Action issued Feb. 10, 2011, in Patent Application No. 2007-524618 (with English Translation).

* cited by examiner

BATTERY MODULE

TECHNICAL FIELD

The present invention relates to a battery system configured by connecting one or more battery modules in series, and particularly to a battery system configured of battery modules each including one or more single-cell lithium-ion batteries.

BACKGROUND ART

Electric automobiles and hybrid cars use an electric motor as a power source or an auxiliary power source. A secondary battery configured of plural single cells connected to one another in series is used as a power source for this type of electric motor. For example, Japanese Patent Application Laid-open Publication No. 2001-204141 has described a secondary battery configured of 60 nickel-metal hydride batteries with a standard voltage of 1.2 V per single cell which are connected to one another in series.

In the case of such nickel-metal hydride batteries, the battery voltage of each single cell is low, and no more than approximately 70 V is obtainable even from the 60 cells connected to one another in series. This makes nickel-metal hydride batteries unsuitable for electric automobiles and the like which are driven with a high voltage and a high output. Another problem with nickel-metal hydride batteries is that the nickel-metal hydride batteries self-discharge when fully charged.

By contrast, lithium-ion batteries are advantageous, for example, in that a high voltage of 300 V to 1000 V and a high output are obtainable, and in that no lithium-ion batteries self-discharge even when fully charged. Against this background, there is an idea about use of a battery pack in which single-cell lithium-ion batteries are connected to one another in series.

Furthermore, in a case of a voltage detecting device of a battery pack for an electric automobile described in Japanese Patent Application Laid-open Publication No. Hei. 11-160367, for example, a main battery for running power storage with a high voltage of 300 V is divided into plural battery modules; thus, the module voltages of the respective battery modules are detected by a differential voltage detection circuit and an A/D converter circuit; and the detected module voltages are transmitted to a signal processing circuit unit. Power is supplied to the differential voltage detection circuit and the A/D converter circuit from an auxiliary battery, but not from the main battery, via a DC-DC converter. This makes it possible to detect the open-circuit module voltages with high precision, and to accordingly avoid unnecessarily shortening the life of the battery pack with the high voltage.

Moreover, a power storage device described in Japanese Patent Application Laid-open Publication No. 2003-70179 includes: plural power storage modules connected to one another in series, each power storage module having plural capacitors which are connected to one another in series; plural subordinate control units, provided correspondingly to the plural power storage modules, and each for controlling the plural capacitors constituting the corresponding power storage modules; and a host control unit for controlling the plural subordinate control units. Each subordinate control unit detects the conditions respectively of the plural capacitors which constitutes the power storage module controlled by the subordinate control unit, and obtains a logical disjunction (OR) or a logical product (AND) of a resultant condition detection signal with an input signal from the high-potential subordinate control unit, thus outputting the result to the low-potential subordinate control unit. This content is described in claims 4 and 5 in the above-mentioned patent official gazette.

In addition, a battery protection IC described in Japanese Patent Application Laid-open Publication No. 2005-117780 is to monitor a block consisting of plural batteries connected to one another in series. The battery protection IC includes: an overvoltage detection circuit for outputting an overvoltage signal in a case where a voltage at a terminal in any one of the batteries in the block becomes equal to, or more than, a prescribed value while the battery pack is being charged; an overdischarge detection circuit for outputting an overdischarge signal in a case where a voltage at a terminal of any one of the batteries becomes equal to, or less than, a prescribed value while the battery pack is being discharged; a first switch for, when detecting the overvoltage signal, turning on and informing that the overvoltage has occurred; and a second switch for, when detecting the overdischarge signal, turning on and informing that the overdischarge has occurred. This content is described in Paragraphs [0024] and [0025] in the above-mentioned patent official gazette.

DISCLOSURE OF THE INVENTION

In a case where, however, a battery system is configured by connecting plural battery modules in series, and where each battery module constitutes a secondary battery in which plural lithium-ion-battery single cells are connected to one another in series, if the single cells are charged and discharged repeatedly, this repetition makes the voltage vary from one single cell to another. For this reason, it is necessary that the voltage of each single cell should be monitored to make sure that none of the single cells are overcharged, or overdischarge.

Furthermore, the main battery consisting of the plural battery modules which has been described in Japanese Patent Application Laid-open Publication No. Hei. 11-1603667 has a high voltage of, for example, 300 V, and each battery module has a high voltage as well. This makes it difficult to monitor the voltage of each battery module under the overall high voltage of the main battery.

Moreover, each of the power storage device described in Japanese Patent Application Laid-open Publication No. 2003-70179 and the battery protection IC described in Japanese Patent Application Laid-open Publication No. 2005-117780 uses a semiconductor device which is designed to operate with voltage supplied from its battery. However, a semiconductor device with a high breakdown voltage has to be used as the semiconductor device used for the higher-voltage battery modules among the plural battery modules connected to one another in series. This pushes up costs.

An object of the present invention is to provide a battery system which allows a semiconductor device with a low breakdown voltage to be used therein.

The battery system according to the present invention is configured by connecting one or more battery modules in series. Each of the one or more battery modules includes: one or more single cells connected to one another in series, in parallel, or in series-parallel; a voltage detection unit for detecting voltages respectively of the one or more single cells; a module monitoring control unit for monitoring the voltages respectively of the one or more cells which have been detected by the voltage detection unit; and a communications circuit through which communications are made between neighboring the battery modules. The battery system includes a master unit for receiving information on the voltages respectively of the one or more single cells from the module monitoring control unit via the communications circuit. The communications circuit includes a first switch element for transmitting a signal of a low-potential battery module to the high-potential battery module. A first series circuit including a first resistor in a high-potential battery module as well as a second resistor and the first switch element in the low-potential battery module is connected between a positive electrode of the highest-potential single cell in the high-potential battery module and a negative electrode of the lowest-potential single cell in the low-potential battery module.

In the case of the battery system according to the present invention, the first switch element is provided between the positive electrode of the highest-potential single cell in the high-potential battery module and the negative electrode of the lowest-potential single cell in the low-potential battery module. Therefore, it suffices if the first switch element has a breakdown voltage which is almost twice as high as the total sum voltage obtained by summing up the voltages respectively of all the single cells in one battery module. This allows semiconductor devices with a low breakdown voltage to be used in the battery system.

BEST MODES FOR CARRYING OUT THE INVENTION

Detailed descriptions will be provided below for a battery system according to embodiments of the present invention with reference to the drawings.

(Embodiment 1)

Figure 1:
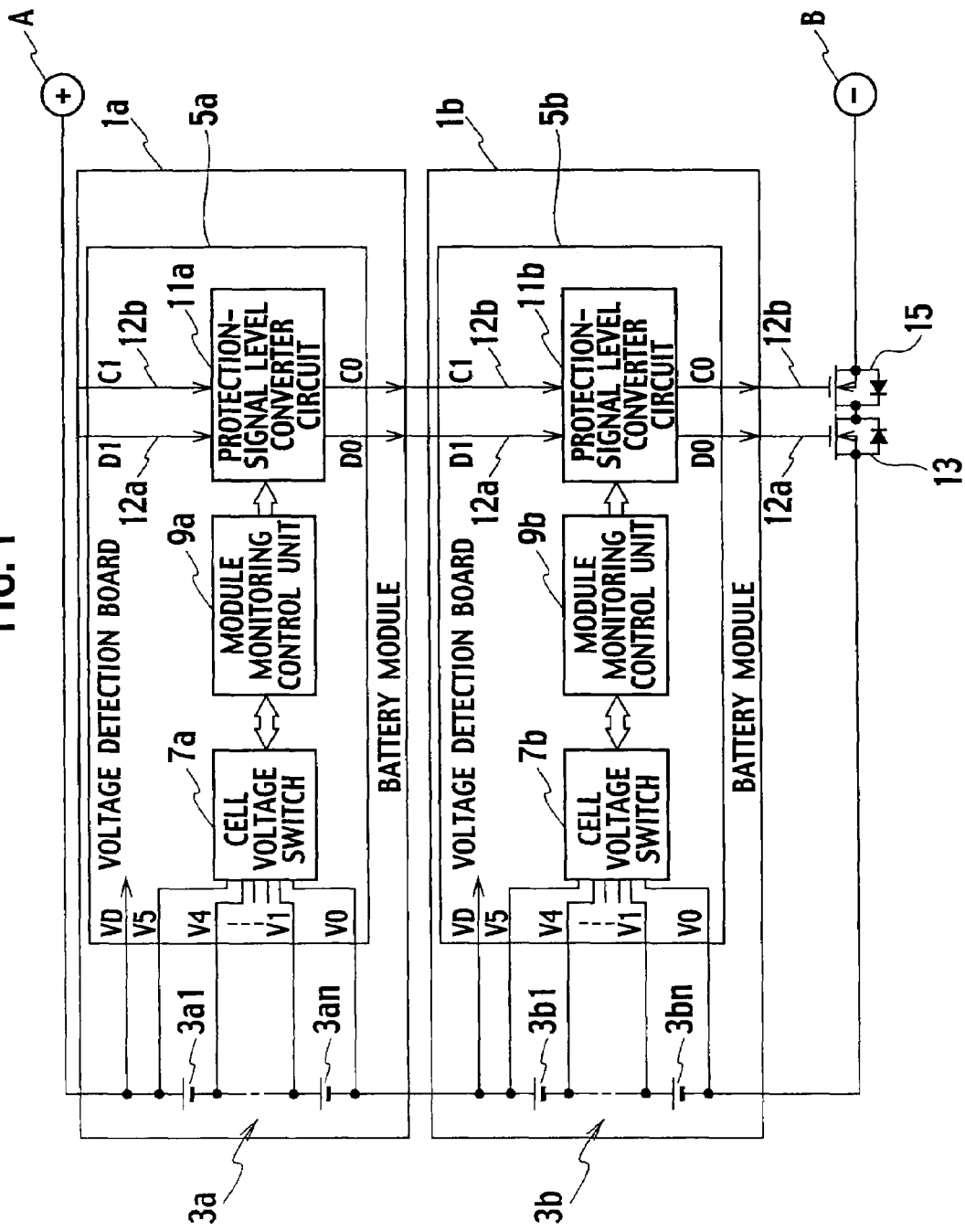
FIG. 1 is a block diagram of a configuration of a battery system according to Embodiment 1 of the present invention.

FIG. 1 is a block diagram of a configuration of a battery system according to Embodiment 1 of the present invention. The battery system shown in FIG. 1 is used, for example, as a battery for electric automobiles and the like, and is configured by connecting a battery module 1a to a battery module 1b in series. It should be noted that the battery system may be configured by connecting three or more battery modules in series.

Power from a generator (not illustrated) or regenerated power from a motor (not illustrated) is designed to be supplied between a + terminal A of the battery module 1a and a − terminal B of the battery module 1b, so that the battery modules 1a and 1b are charged. In addition, the battery modules 1a and 1b are designed to discharge by a drive of the motor.

The battery modules 1a and 1b respectively include: plural single cells 3a1 to 3an and 3b1 to 3bn connected to one another in series; cell voltage switches 7a and 7b; module monitoring control units 9a and 9b; and protection-signal level converter circuits 11a and 11b. Each of the plural single cells consists of a lithium-ion battery, and has a high voltage and a high output.

Each of the cell voltage switches 7a and 7b corresponds to a voltage detection unit according to the present invention, and includes switches for the respective single cells. When voltages of the respective single cells are measured, the cell voltage switches 7a and 7b turns on based on ON signals from the module monitoring control units 9a and 9b, respectively to sense the voltages of the respective single cells. Thereby, the voltages respectively of the plural single cells 3a1 to 3an and 3b1 to 3bn are detected.

The module monitoring control units 9a and 9b output a protection signal for overcharge inhibition to the protection-signal level converter circuits 11a and 11b, in a case where any one of the voltages detected by the cell voltage switches 7a and 7b becomes equal to an upper limit value (for example, 4.3 V), respectively. The module monitoring control unit 9a and 9b output a protection signal for overdischarge inhibition to the protection-signal level converter circuits 11a and 11b, in a case where any one of the voltages detected by the cell voltage switches 7a and 7b becomes equal to a lower limit value (for example, 2.5 V), respectively.

The protection-signal level converter circuit 11a corresponds to communications means according to the present invention, and converts the level of the voltage of the battery module 1a to match with the voltage of the battery module 1b. When, for example, the voltage of the battery module 1b is 0 V to 12 V, and concurrently when the negative terminal of the lowest-potential single cell among the plural single cells in the battery module 1b is at the reference potential 0 V, the voltage of the battery module 1a is 12 V to 24 V. In this case, the protection-signal level converter circuit 11a converts the level of the voltage of the battery module 1a from the level of 12 V to 24 V to the level of 0 V to 12 V in order that the level of a signal from the battery module 1a can match the level of a signal from the battery module 1b.

The protection-signal level converter circuit 11a outputs the overcharge inhibiting protection signal, which has come from the module monitoring control unit 9a in the same battery module 1a as the circuit 11a is included in, to the protection-signal level converter circuit 11b in the battery module 1b via a signal line 12b. The protection-signal level converter circuit 11a outputs the overdischarge inhibiting protection signal, which has come from the module monitoring control unit 9a in the same battery module 1a as the circuit 11a is included in, to the battery module 1b via a signal line 12a.

The protection-signal level converter circuit 11b corresponds to communications means according to the present invention, outputs the OR of the overcharge inhibiting protection signal from the module monitoring control unit 9b in the same battery module 1b as the circuit 11b is included in and the overcharge inhibiting protection signal from the module monitoring control unit 9a in the battery module 1a to a charge inhibiting switch 15 via the signal line 12b. The protection-signal level converter circuit 11b outputs the OR of the overdischarge inhibiting protection signal from the module monitoring control unit 9b in the same battery module 1b as the circuit 11b is included in and the overdischarge inhibiting protection signal from the module monitoring control unit 9a in the battery module 1a to a discharge inhibiting switch 13 via the signal line 12a.

The discharge inhibiting switch 13 and the charge inhibiting switch 15 are connected to each other in series, each consisting of a MOSFET, and provided between the batter module 3b and the − terminal. It should be noted that a thyristor, GTO, IGBT, or the like may be used for the discharge inhibiting switch 13 and the charge inhibiting switch 15. The discharge inhibiting switch 13 turns off, and inhibits the one or more single cells from overdischarging, based on the discharge inhibiting protection signal from the protection-signal level converter circuit 11b. The charge inhibiting switch 15 turns off, and inhibits the one or more single cells from being overcharged, based on the charge inhibiting protection signal from the protection-signal level converter circuit 11b.

In the case of the battery system according to Embodiment 1 thus configured, in the battery modules 1a and 1b, when the voltage detection units 7a and 7b sense the voltages of the plural single cells, the respective module monitoring control units 9a and 9b output the overcharge inhibiting protection signal in the case where any one of the voltages thus detected becomes equal to the upper limit value. Otherwise, the module monitoring control units 9a and 9b output the overdischarge inhibiting protection signal in the case where any one of the voltages thus detected becomes equal to the lower limit value. For example, in a case where some signal cells are overcharged in the battery module 1a, the overcharge inhibiting protection signal is sent to the protection-signal level converter circuit 11a.

The protection-signal level converter circuit 11a sends the overcharge inhibiting protection signal to the protection-signal level converter circuit 11b. The protection-signal level converter circuit 11b obtains an OR of the protection signal (not existing in this case) from the module monitoring control unit 9b in the same module 1b as the circuit 11b is included in and the protection signal (existing in this case) from the battery module 1a, and outputs the OR to the charge inhibiting switch 15. The charge inhibiting switch 15 inhibits the single cells from overdischarging based on the protection signal from the level converter circuit 11b. In the case of overcharge, an operation similar to that for overdischarge is carried out. As a result, it is possible to prevent overcharge and overdischarge from occurring in—every single cell.

In addition, the protection signal outputted as the OR is transferred to one of the discharge inhibiting switch 13 and the charge inhibiting switch 15 via the signal lines 12a and 12b, respectively. Each of the two circuits is configured of the logic circuit only, and no arithmetic circuit such as a microcomputer is used. This enables the signals to be transmitted at a high speed, and accordingly enables the processes to be carried out at a high speed.

Figure 2:
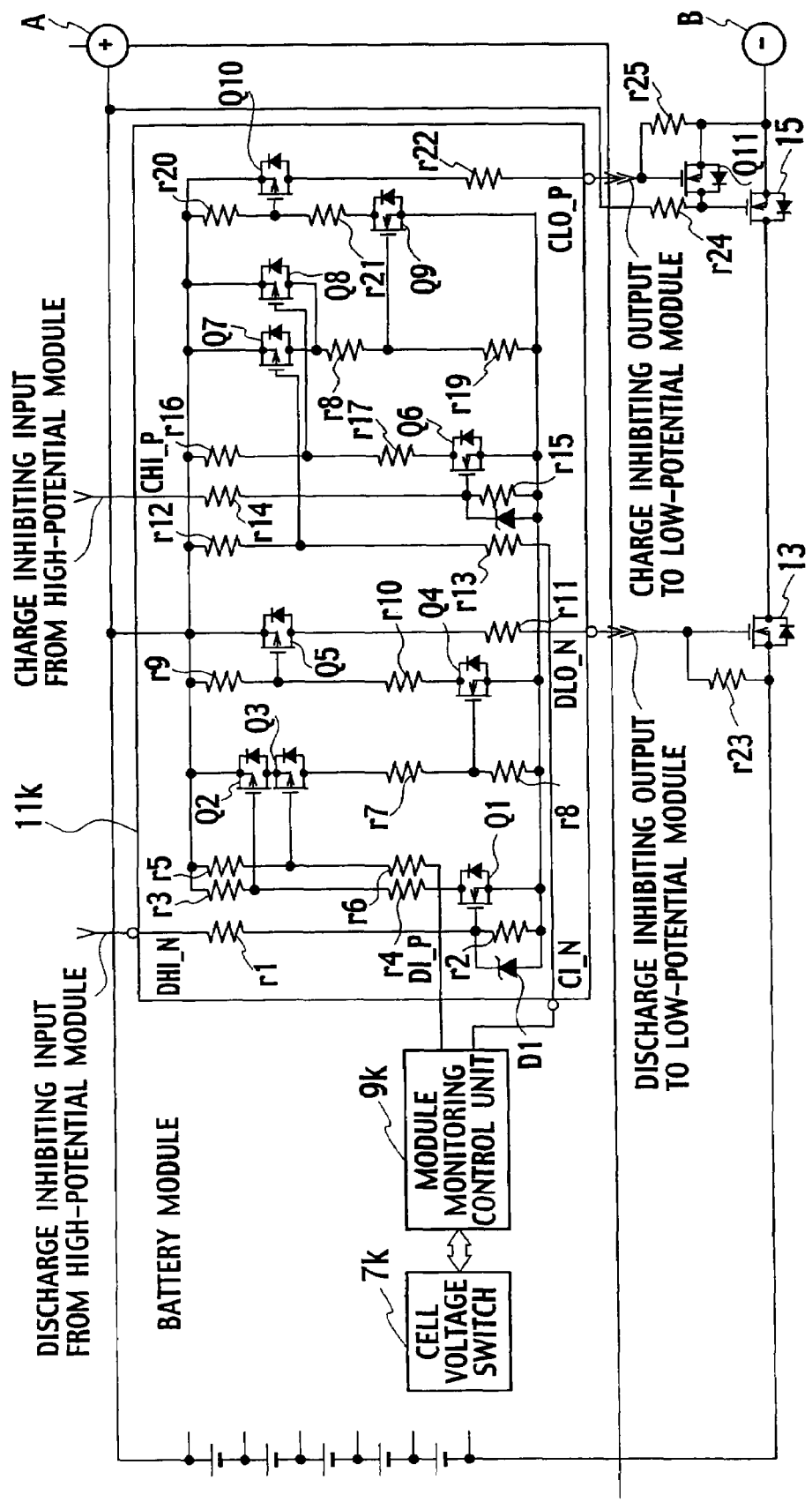
FIG. 2 is a detailed circuit diagram of a protection-signal level converter circuit in a battery module in the battery system according to Embodiment 1.

FIG. 2 shows a detailed circuit diagram of the protection-signal level converter circuit in a battery module in the battery system according to Embodiment 1. FIG. 2 shows an internal configuration of the kth battery module 5k in the battery system in which n (three or more) battery modules are connected to one another in series.

When overcharge occurs, first of all, the charge inhibiting (CI) signal turns active, and a switch Q7 turns on (closes) on based on a charge inhibiting input CI (L level) from a module monitoring control unit 9k. Otherwise, a switch Q6 turns on based on a charge inhibiting input (H level) from a high-potential module; a bias current flows to resistors r16 and r17; and a switch Q7 turns on. When the current flows to the switch Q7 or a switch Q8, the bias current flows a resistor r18 and a resistor r19, and a switch Q9 and a switch Q10 turn on. Subsequently, the current flows to a resistor r22; a charge inhibiting output is outputted to a low-potential module; and finally the charge inhibiting switch 15 is turned off. In this manner, the minute amount of current as the charge inhibiting input flows from the high-potential module to the low-potential module. This enables the protection signal to be communicated between the battery modules at a high speed with low power consumption. It should be noted that, when the charge inhibiting switch 15 is on, the bias current at the level converter unit represents a leakage current only, and the battery system is in a power saving mode.

Secondly, when an overdischarge occurs, the discharge inhibiting (DI) signal turns non-active. At this time, a switch Q3 turns off (opens) based on a discharge inhibiting input DI (H level) from the module monitoring control unit 9k, and thus the current stops flowing to resistors r7 and r8. A switch Q4 turns off; the current flows to a resistor r9 and a resistor r10; a switch Q5 turns off; and a discharge inhibiting output (L level) is outputted to a low-potential module. The bias current stops flowing to a resistor r23, and thus the discharge inhibiting switch 13 turns off. When a discharge inhibiting input (L level) is received from a high-potential module, the bias current stops flowing to resistors r1 and r2; switches Q1, Q2, Q4 and Q5 turn off; and a switch Q13 similarly turns off.

On the other hand, in a case where no charge inhibition comes from the module of its own or a high-potential module, the switches Q6, Q7 Q8, Q9 and Q10 remain off, and thus no charge inhibiting output is outputted to a low-potential module. No current flows to a resistor r24, and the switch 15 remains on. Similarly, in a case where no discharge inhibition comes from the module of its own or a high-potential module, the switched Q1, Q2, Q3, Q4 and Q5 are on; the bias current flows to the resistors r11 and r13; and the switch Q13 is on. The resistors r1 to r24 may have high resistances. As a result, only the minute amount of current flows in the circuit in any condition, and the battery system accordingly consumes less power.

It should be noted that the cell voltage switch and the module monitoring control unit are operated with a voltage between VD and VO.

(Embodiment 2)

Figure 3:
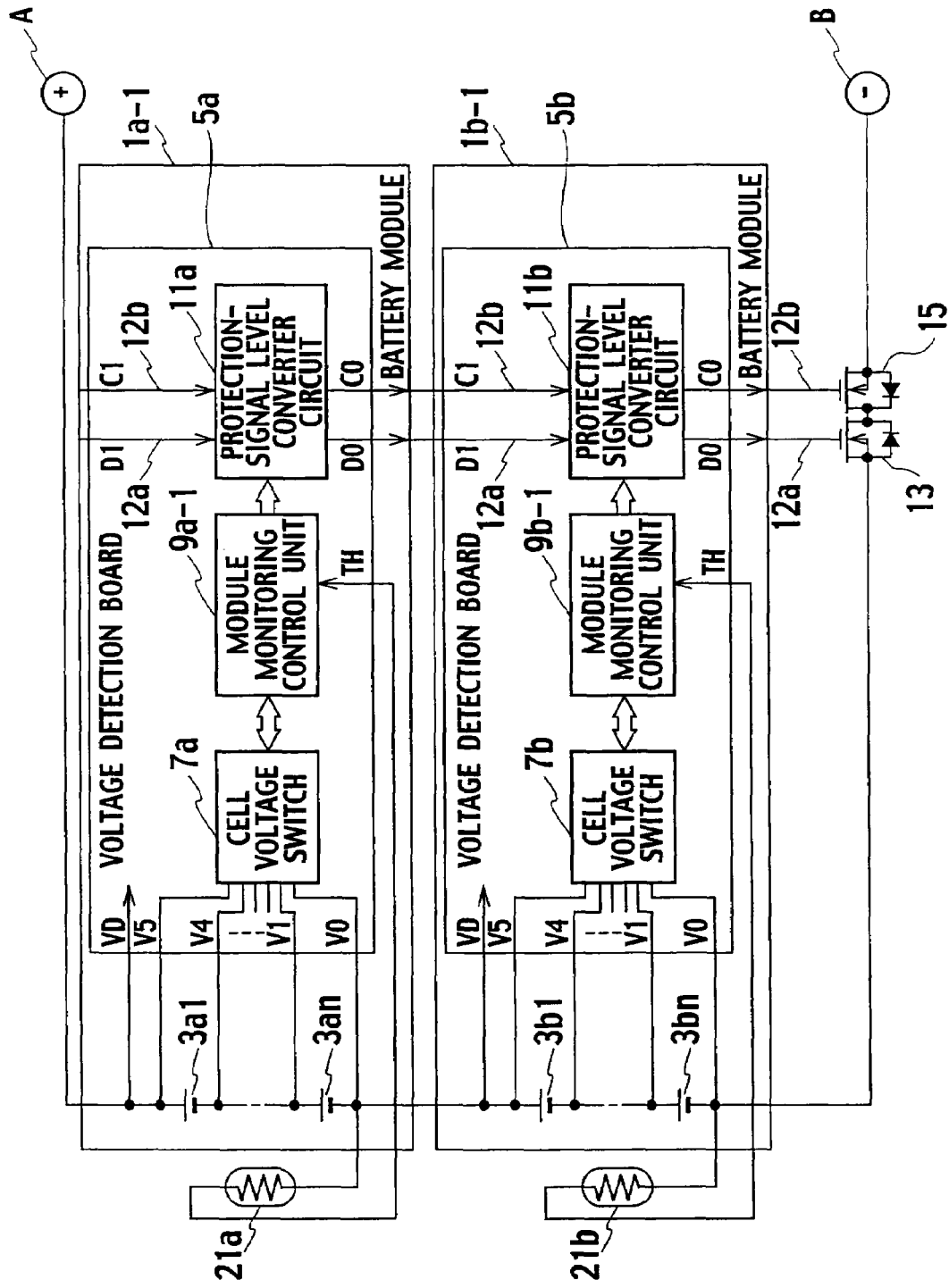
FIG. 3 is a block diagram of a configuration of a battery system according to Embodiment 2 of the present invention.

A battery system shown in FIG. 3 includes temperature detections 21a and 21b, such as thermistors, as temperature detection units for detecting the temperatures of the plural single cells in battery modules 1a-1 and 1b-1, respectively, in addition to the configuration of the battery system according to Embodiment 1 shown in FIG. 1.

Moreover, based on information on the temperatures detected by the temperature detections 21a and 21b, module monitoring control units 9a-1 and 9b-1 output an overdischarge inhibiting protection signal and an overcharge inhibiting protection signal to the protection-signal level converter circuits 11a and 11b when the temperatures become equal to, or higher than the corresponding predetermined temperatures, respectively.

The protection-signal level converter circuit 11b outputs the overdischarge inhibiting protection signal to the discharge inhibiting switch 13, and the overcharge inhibiting protection signal to the charge inhibiting switch 15.

In the case where the plural modules are used by being connected to one another in series, the thermistors need to be separated from the batteries with an insulating material interposed in between for the purpose of keeping the withstand voltage between the batteries and the thermistors. If, however, the thermistors are separated from the batteries with the insulating material interposed in between, this separation makes it impossible to measure the temperatures with precision. In contrast, if, in each of modules whose electric potentials are equal to each other, the temperature is measured via the thermistor from the module monitoring control unit, this design makes it possible to measure the temperature with precision in spite of the high voltage of the module, as in the case of the present example.

In a case where the temperatures respectively of the plural single cells becomes equal to, or higher than, the predetermined temperature as described above, an abnormality is regarded as having occurred in the single cells, and the overdischarge and overcharge are inhibited. This makes it possible to enhance the safety of the battery system.

(Embodiment 3)

Figure 4:
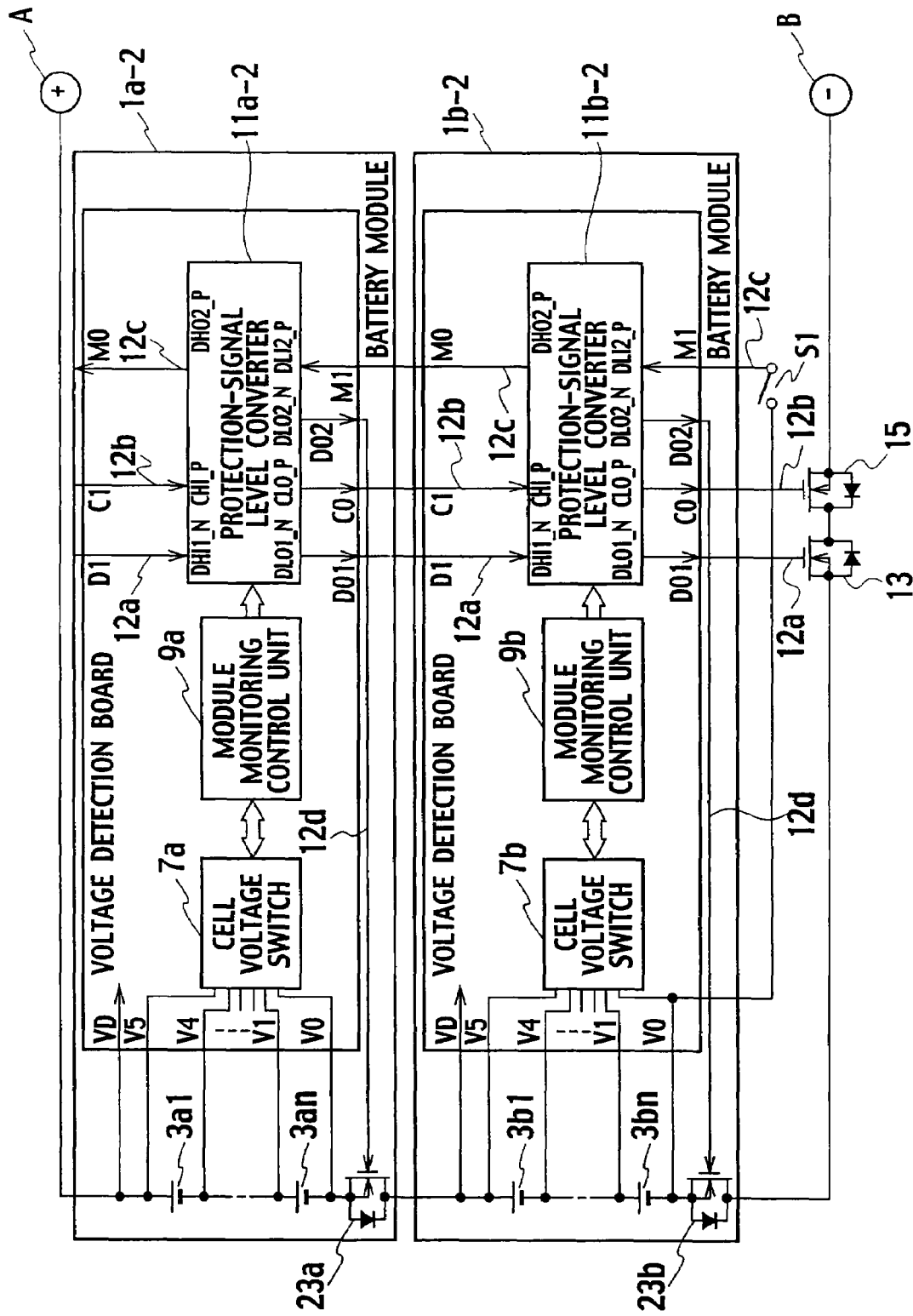
FIG. 4 is a block diagram of a configuration of a battery system according to Embodiment 3 of the present invention.

FIG. 4 is a block diagram of a configuration of a battery system according to Embodiment 3 of the present invention. The battery system according to Embodiment 3 shown in FIG. 4 is characterized in that battery modules 1a-2 and 1b-2 further include discharge inhibiting switches 23a and 23b, which are connected to plural single cells 3a1 to 3an and 3b1 to 3bn, and which inhibit the plural single cells 3a1 to 3an and 3b1 to 3bn from discharging while the battery modules 1a-2 and 1b-2 are assembled with each other, respectively, in addition to the configuration of the battery system according to Embodiment 1 shown in FIG. 1.

A protection-signal level converter circuit 11b-2 outputs a discharge inhibition releasing signal, which has come from a discharge inhibition releasing switch S1, to a protection-signal level converter circuit 11a-2 and the discharge inhibiting switch 23a in the battery module 1a-2.

Based on the discharge inhibition releasing signal from the protection-signal level converter circuit 11b-2, the discharge inhibiting switch 23a turns on, and thus releases the plural single cells 3a1 to 3an from the discharge inhibition. Based on the discharge inhibition releasing signal from the discharge inhibition releasing switch S1, the discharge inhibiting switch 23b turns on, and thus releases the plural single cells 3b1 to 3bn from the discharge inhibition.

In the case of the battery system according to Embodiment 3, as described above, while battery modules 3a and 3b are assembled with each other, the discharge inhibiting switch 23a cuts off the terminals of the battery module 3a from each other, whereas the discharge inhibiting switch 23b cuts off the terminals of the battery module 3b from each other. These cut off make it possible to inhibit the plural single cells 3a1 to 3an and 3b1 to 3bn from discharging, respectively. This makes it possible to enhance the safety while the battery modules are assembled with each other.

Furthermore, after the assembling of the battery modules is completed, the discharge inhibition releasing switch S1 is turned on; thereby, the discharge inhibition releasing signal is transmitted to the discharge inhibiting switch 23b; and the discharge inhibition releasing signal is transmitted to the discharge inhibiting switch 23a via the level converter circuit 11a-2. For this reason, the discharge inhibiting switches 23a and 23b turn on so that the discharge inhibition is released.

Figure 5:
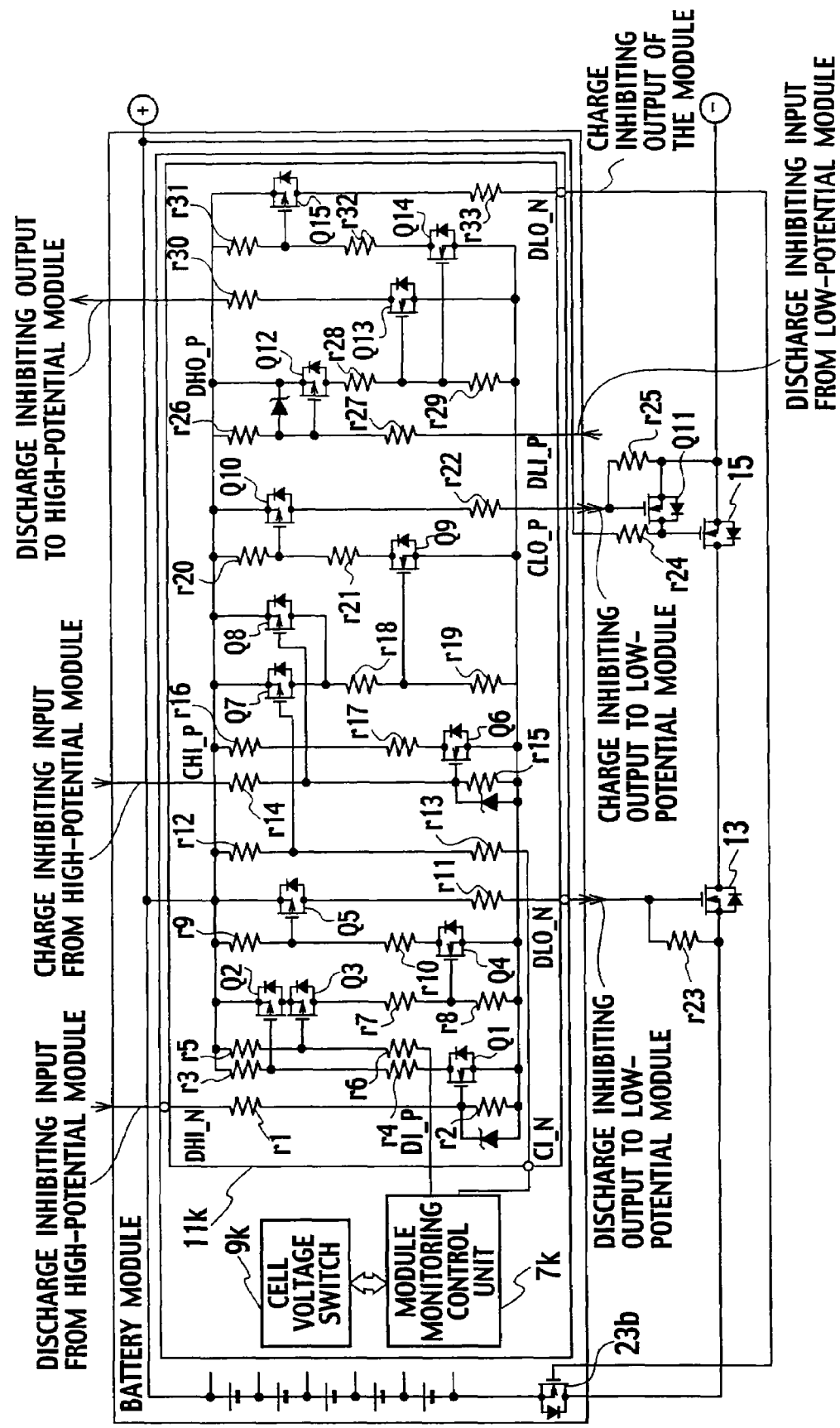
FIG. 5 is a detailed circuit diagram of a protection-signal level converter circuit shown in FIG. 4.

FIG. 5 is a detailed circuit diagram of the protection-signal level converter circuit shown in FIG. 4. The resistors r1 to r25 are designed to carry out completely the same operations as those in FIG. 2. When a discharge inhibiting input DLI (H level) from the low-potential module or the switch S1 shown in FIG. 4 turns to open H level, the bias current stops flowing to resistors r26 and r27. Thus, switches Q12, Q13, Q14 and Q15 turn off; the current stops flowing to a resistor r33; and the discharge inhibiting switch 23b in the module turns off.

On the other hand, in a case where the switch S1 shown in FIG. 4 is on, or where the discharge inhibiting input DLI from the low-potential module is at L level, the bias current flows to the resistors r26 and r27, and thus all of the switches Q13 to Q15 turn on. The bias current flows to the resistor r33, and thus the discharge inhibiting switch 23b in the module turns on.

(Embodiment 4)

Figure 6:
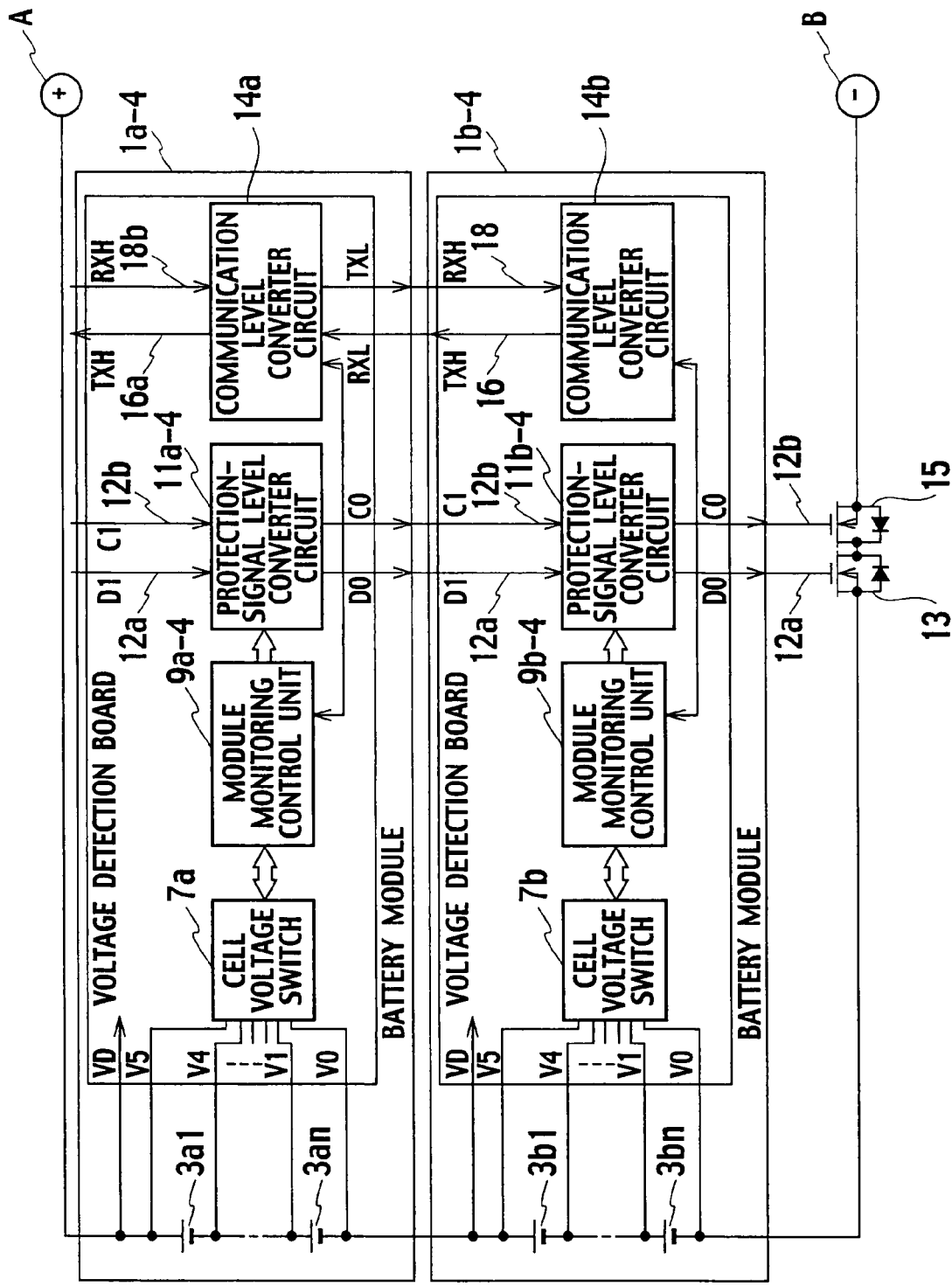
FIG. 6 is a block diagram of a configuration of a battery system according to Embodiment 4 of the present invention.

FIG. 6 is a block diagram of a configuration of a battery system according to Embodiment 4 of the present invention. In the case of the battery system shown in FIG. 6, battery modules 1a-4 and 1b-4 include cell voltage switches 7a and 7b, module monitoring control units 9a-4 and 9b-4, protection-signal level converter circuits 11a-4 and 11b-4, and communications level converter circuits 14a and 14b, respectively.

The communications level converter circuit 14a and the communications level converter circuit 14b are connected to each other with transmit-receive signal lines 16a and 18a, and causes data to be communicated between neighboring the battery modules.

A first example of a communications protocol used for communications between the communications level converter circuits 14a and 14b is that a single master mode is adopted for transmission so that a slave module transmits data only when the slave module receives an instruction from the master module. The length of data to be transmitted is 8 bits, for example. Data is transmitted LSB first in UART mode with 1 stop bit. For reception, data outputted from another slave module is received as well.

A second example of the communications protocol used for communication between the communications level converter circuits 14a and 14b is that a message frame is used. The message frame consists of headers and responses. The header is a frame outputted by a mater module, and is configured of Synch Break, Synch Field, Ident Field and Command Field.

Synch Break indicates the start of a frame; Synch Field compensates frequency errors of the respective nodes; Ident Field consists of IDs, and means which module should be assigned as a slave; Command Field specifies response data through which information on the position, voltage, temperature, error, and the like of each of the single cells in a module is requested to be sent out from the module.

Figure 8:
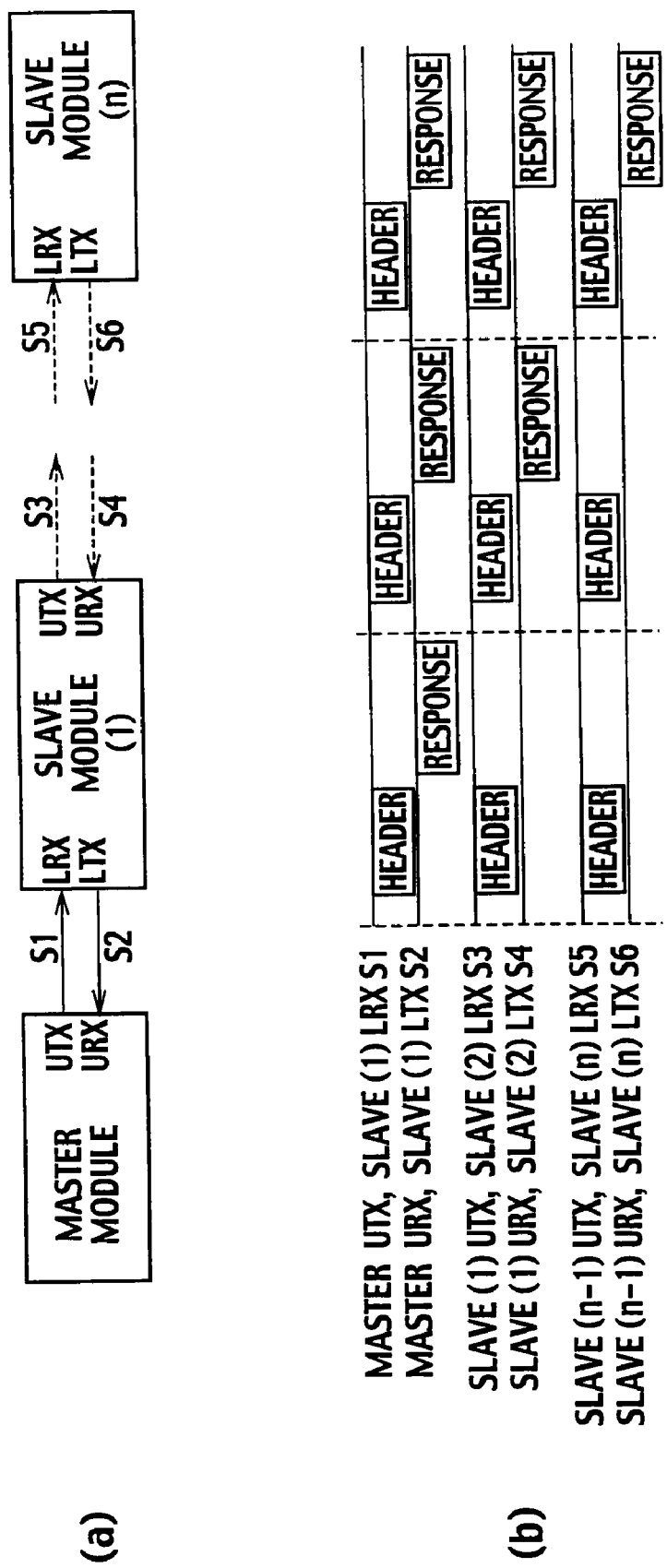
FIGS. 8(a) and 8(b) are diagrams each illustrating a communications protocol for the communications level converter circuit in the battery module in the battery system according to Embodiment 4 of the present invention.

The response is a frame to be outputted by a module assigned as a slave by the master or the master module, and consists of data and checksum. The data consists of three types of data, that is to say, two-byte data, four-byte data and 8-byte data. The checksum is that for error detection, and is obtained by inverting the result of performing modulo 256 arithmetic. FIG. 8 shows the second example of the communications protocol.

The module monitoring control unit 9b-4 includes the function performed by the module monitoring control unit 9b shown in FIG. 1. Furthermore, as the master, the unit 9b-4 requests the module monitoring control unit 9a-4 as the slave, via the communications level converter circuits 14a and 14b, to transmit information on the position of a single cell overdischarging or overcharged and information on the voltage of the single cell to the unit 9b-4.

The module monitoring control unit 9a-4 includes the function performed by the module monitoring control unit 9a shown in FIG. 1. In response to the request from the module monitoring control unit 9b-4 as the master via the communications level converter circuits 14a and 14b, the module monitoring control unit 9a-4 as the slave outputted the information on the position of the single cell overdischarging or overcharged and the information on the voltage of the single cell to the module monitoring control unit 9b-4 as the master via the communications level converter circuits 14a and 14b.

The monitoring control unit 9b-4 as the master may serve the purpose that Smart Battery System used, for example, for communications between a note-type personal computer and its battery pack is used as communications means. In the case of automobiles and the like, it has been proposed that communications means such as a CAN (Controller Area Network) and a LAN (Local Area Network) should be used as a standard system. Compliance with the standard enables the module to communicate with the outside.

It should be noted that the rest of the configuration is the same as the configuration of the battery system according to Embodiment 1 shown in FIG. 1. For this reason, the same components will be denoted by the same reference numerals.

Figure 7:
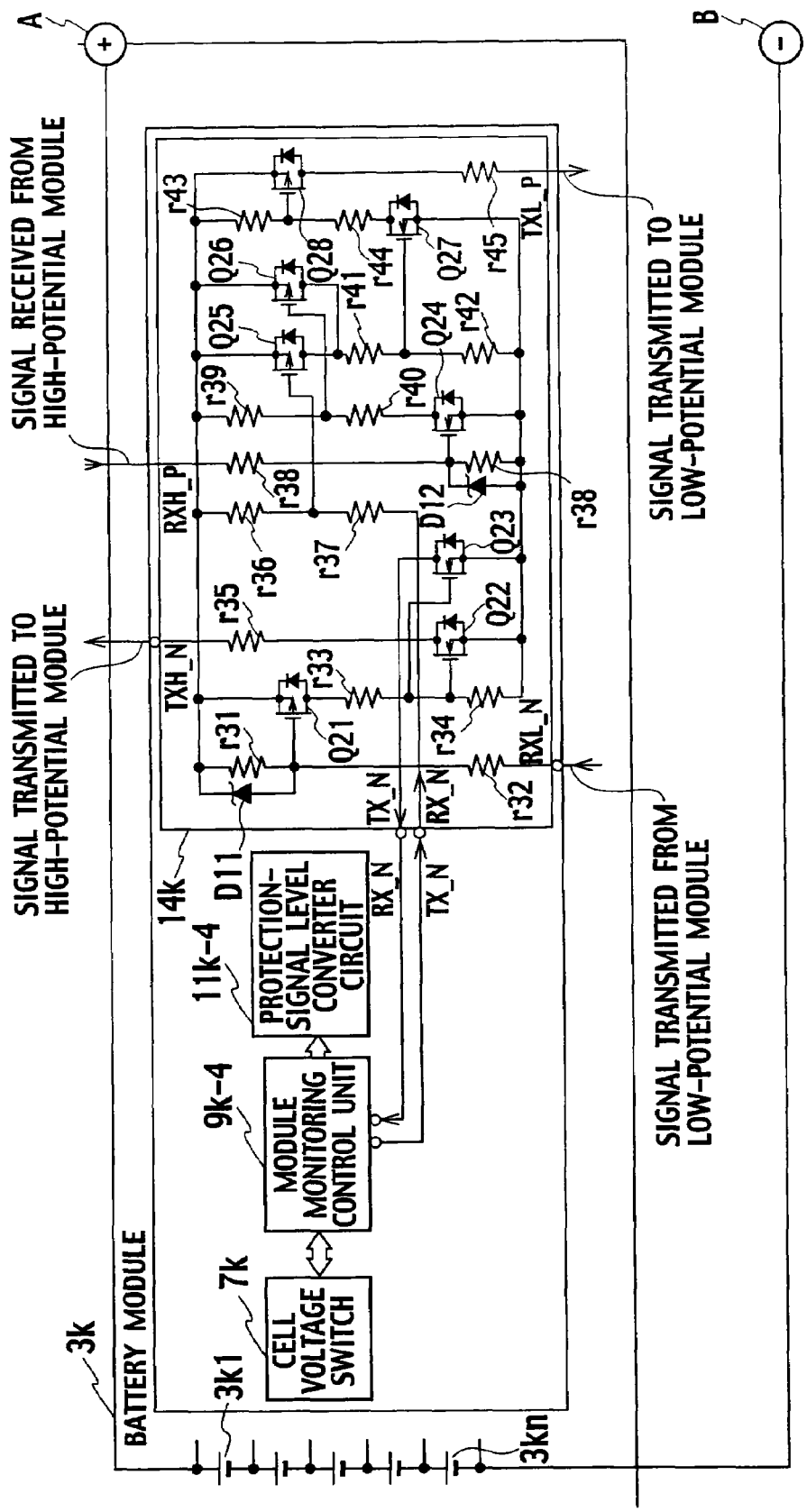
FIG. 7 is a detailed circuit diagram of a communications level converter circuit in a battery module in the battery system according to Embodiment 4 of the present invention.

FIG. 7 is a detailed circuit diagram of the communications level converter circuit in each of the battery modules in the battery system according to Embodiment 4 of the present invention. FIG. 7 shows the internal configuration of the kth battery module in the battery system in which n (three or more) battery modules are connected to one another in series.

It should be noted that the transmit-receive signal lines are negative logic (denoted by reference numeral N in the diagram), and turn to the high potential while non-active. Similarly, a signal received from the low-potential module and a signal transmitted to the high-module are negative logic. On the other hand, an input received from the high-potential module and an output transmitted to the low-potential module are positive logic (denoted by reference numeral P in the diagram).

First of all, when data is transmitted (TX) from a module monitoring control unit 9k-4, the data is inputted to a switch Q25 so that the switch Q25 turns on, and the current flows to resistors r41 and r42. Thus, switches Q27 and Q28 turn off, and the data is transmitted to the low-potential module. In addition, a switch Q21 turns on whereas a switch Q22 turns off; and thus the date is transmitted to the high-potential module. On the other hand, when the module monitoring control unit 9k-4 is going to receive (RX) data, the data transmitted from the low-potential module is inputted to the switch Q21; thus the switch Q21 turns on; the switch Q23 turns off; and the input of the data transmitted from the low-potential module is received.

In the case of such a configuration, in response to the request from the module monitoring control unit 9b-4, the module monitoring control unit 9a-4 outputs the information on the position of a single cell overdischarging or overcharged and the information on the voltage of the single cell to the module monitoring control unit 9b-4 as the master via the communications level converter circuits 14a and 14b. Based on the information on the position of the single cell overdischarging or overcharged and the information on the voltage of the single cell, the module monitoring control unit 9b-4 as the master is capable of grasping what single cell overdischarges or is overcharged. In addition, the module monitoring control unit 9b-4 as the master is capable of grasping in what single cell the voltage is abnormal based on the information on the voltage. Moreover, based on the information on the temperatures received from the temperature detections as in Embodiment 2, the module monitoring control unit 9b-4 as the master is capable of grasping whether or not the voltage is abnormal in any one of the single cells.

(mbodiment 5)

Figure 9:
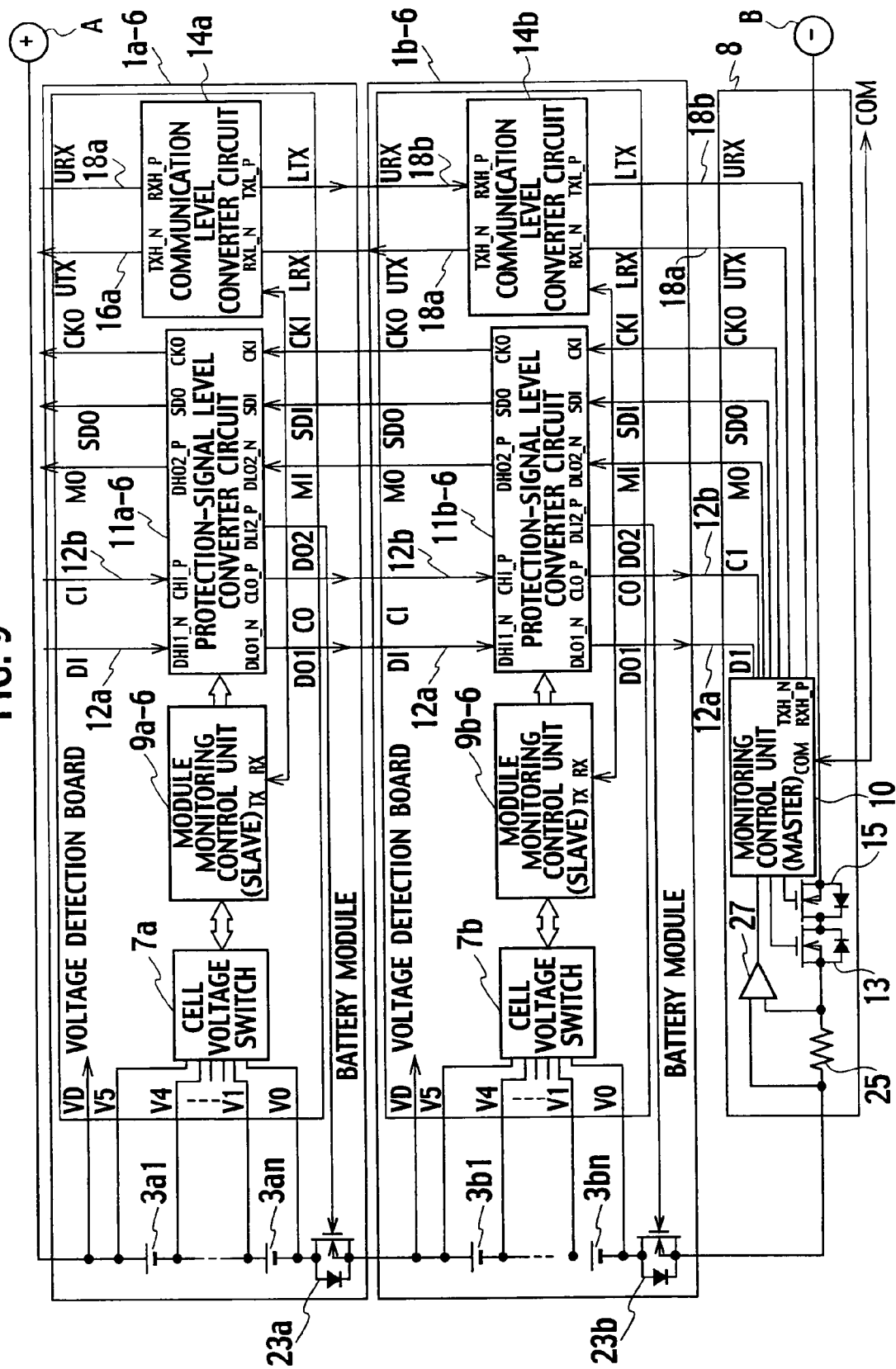
FIG. 9 is a block diagram of a configuration of a battery system according to Embodiment 5 of the present invention.

FIG. 9 is a block diagram of a configuration of a battery system according to Embodiment 5 of the present invention. The battery system shown in FIG. 9 is configured by connecting battery modules 1a-6 and 1b-6, which are connected to each other in series, to a master unit 8 for monitoring and controlling the entire battery system in series.

The battery modules 1a-6 and 1b-6 respectively include: the plural single cells 3a1 to 3an and 3b1 to 3bn connected to one another in series; the cell voltage switches 7a and 7b; module monitoring control units 9a-6 and 9b-6; protection-signal level converter circuits 11a-6 and 11b-6; the communications level converter circuits 14a and 14b; and the discharge inhibiting switches 23a and 23b.

The module monitoring control units 9a-6 and 9b-6 include the functions of the module monitoring control units 9a and 9b shown in FIG. 1, and operate as slaves to a monitoring control unit 10, respectively. The protection-signal level converter circuits 11a-6 and 11-6 include: a function of inputting a discharge inhibiting input (DI) from a high-potential module, and outputting a level-converted discharge inhibiting output (DO1) to a low-potential module or the master unit 8; a function of inputting a charge inhibiting input (CI) from the high-potential module, and outputting a level-converted charge inhibiting output (CO) to the low-potential module or the master unit 8; a function of inputting a module discharge inhibiting input (MI) from the low-potential module or the master unit 8, outputting a level-converted module discharge inhibiting output (MO) to the high-potential module, and outputting a self-module discharge inhibiting output (DO2). A detailed circuit configuration for performing the foregoing level conversions can be realized by use of the circuit which has already been shown in FIG. 5.

The protection-signal level converter circuits 11a-6 and 11b-6 further include: a function of inputting a clock input (CKI) from the low-potential module or the master unit 8, and outputting a level-converted clock output (CKO) to the high-potential module; a function of inputting a shutdown input (SDI) from the low-potential module or the master unit 8, and outputting a level-converted shutdown output (SDO) to the high-potential module. The level conversions of these clock signals and shutdown signals can be realized by use of a method similar to that of the level conversions shown in FIG. 5.

The module monitoring control units 9a-6 and 9b-6 receive clock signals from the protection-signal level converter circuits 11a-6 and 11b-6, and measure the voltages of the corresponding single cells in synchronism with the clock signals, respectively. The module monitoring control units 9a-6 and 9b-6 respectively receive shutdown signals from the protection-signal level converter circuits 11a-6 and 11b-6. When the shutdown signals are given thereto, the module monitoring control units 9a-6 and 9b-6 respectively shut downs the power supplies of the cell voltage switches 7a and 7b as well as the own module monitoring control units, and the power supplies of the communications level converter circuits 14a and 14b, and thereby reduces their power consumptions. When the shutdown signals are released, the module monitoring control units 9a-6 and 9b-6 turn on their power supplies, rise, and thus start operations in synchronism with the clock signals, respectively.

The master unit 8 includes the monitoring control unit 10 as the master, the discharge inhibiting switch 13, the charge inhibiting switch 15, a resistor 25 and an error amplifier 27. The resistor 25, the discharge inhibiting switch 13 and the charge inhibiting switch 15 are connected to one another in series. The master unit 8 is provided between battery modules 3b and the − terminal B.

The monitoring control unit 10 turns off the discharge inhibiting switch 13 based on a protection signal for overdischarge inhibition from the protection-signal level converter circuit 11b-6, and thereby cuts off the current flowing to the battery modules 3a and 3b. The monitoring control unit 10 turns off the charge inhibiting switch 15 based on a protection signal for overcharge inhibition from the protection-signal level converter circuit 11b-6, and thereby cuts off the current flowing to the battery modules 3a and 3b. These make it possible to inhibit the plural single cells 3a1 to 3an and 3b1 to 3bn from overdischarging or being overcharged.

In addition, the error amplifier 27 amplifies the voltage between the two ends of the resistor 25 as an error voltage. In a case where the error voltage becomes equal to, or larger than, a predetermined voltage, the monitoring control unit 10 regards an overcurrent as having flowed in the resistor 25, and thus turns off the charge inhibiting switch 15, hence cutting off the current. Thereby, an overcurrent protection is carried out.

Furthermore, the current flowing in the battery system can be measured by measuring the voltage resulting from the amplification of the voltage between the two ends of the resistor 25 by the differential amplifier 27. The integral of this current found by the monitoring control unit 10 makes it possible to grasp how the battery is charged. In a case where, judging from the current flowing therein and how the battery is charged, the current is small in amount whereas the amount of electricity remaining in the battery is large, the clock output CKO is outputted as a low-speed clock. The voltages of the respective cells are measured while the power consumptions of the respective module monitoring control units 9a-6 and 9b-6 are being reduced. A shutdown signal SDO is outputted simultaneously when the measurement is completed. Thereby, the power consumptions in the modules are reduced. The monitoring control unit 10 itself reduces its power consumption by turning itself into a low-speed clock mode or in a sleep mode, in a case where the current flowing therein is small in amount to some extent.

The monitoring control unit 10 is provided with an interrupt function. When the amount of the current flowing therein becomes larger than a certain level, that is to say, when the voltage outputted from the differential amplifier 27 exceeds a certain threshold value, the monitoring control unit 10 rises from the sleep mode into a normal operation mode. Furthermore, in a case where the current is very large in amount, the monitoring control unit 10 outputs the clock output CKO as a high-speed clock, and thus makes the module monitoring control units 9a-6 and 9b-6 always operate, thereby frequently performs the voltage measurement, and accordingly enhances the protection function. In addition, the monitoring control unit 10 itself operates with the high-speed clock, thus shortens time needed for performing an integral of the current values, performs the integral of the current values with higher precision, and accordingly precisely measures the amount of electricity remaining in the battery.

In a case where the monitoring control unit 10 receives the charge inhibiting input CI or the discharge inhibiting input DO, the charge inhibiting switch 15 or the discharge inhibiting switch 13 cuts off the currents flowing therethrough. Thereafter, the monitoring control unit 10 collects information on protection signals and information on the voltages of the respective single cells from the module monitoring control units 9a-6 and 9b-6 as the slaves via the communications level converter circuits 14a and 14b. Based on the collected information on the protection signals and the information on the voltages of the respective single cells, the monitoring control unit 10 determines in what single cell an abnormality has occurred. This makes it possible to grasp in what single cell the abnormality has occurred.

In addition, in response to a request from an external apparatus COM, the monitoring control unit 10 outputs the information on the protection signals and the information on the voltages of the respective single cells to the external apparatus. This makes it possible for the external apparatus to manage the charge and discharge of the battery modules 3a and 3b.

Furthermore, when the monitoring control unit 10 receives a maintenance command from the external apparatus COM, first of all, based on this maintenance command, the monitoring control unit 10 turns off the discharge inhibiting switch 13, and transmits the discharge inhibiting signal MO to the module monitoring control units 9b-6 and 9a-6 via the communications level converter circuits 14b and 14a. Upon receipt of the discharge inhibiting signal (MI), the protection-signal level converter circuit 11b-6 outputs the discharge inhibiting output DO2, and thus turns off the discharge inhibiting switches 23a and 23b. This makes it possible to inhibit the modules from discharging, and to accordingly carry out the maintenance operation safely.

(Embodiment 6)

Figure 10:
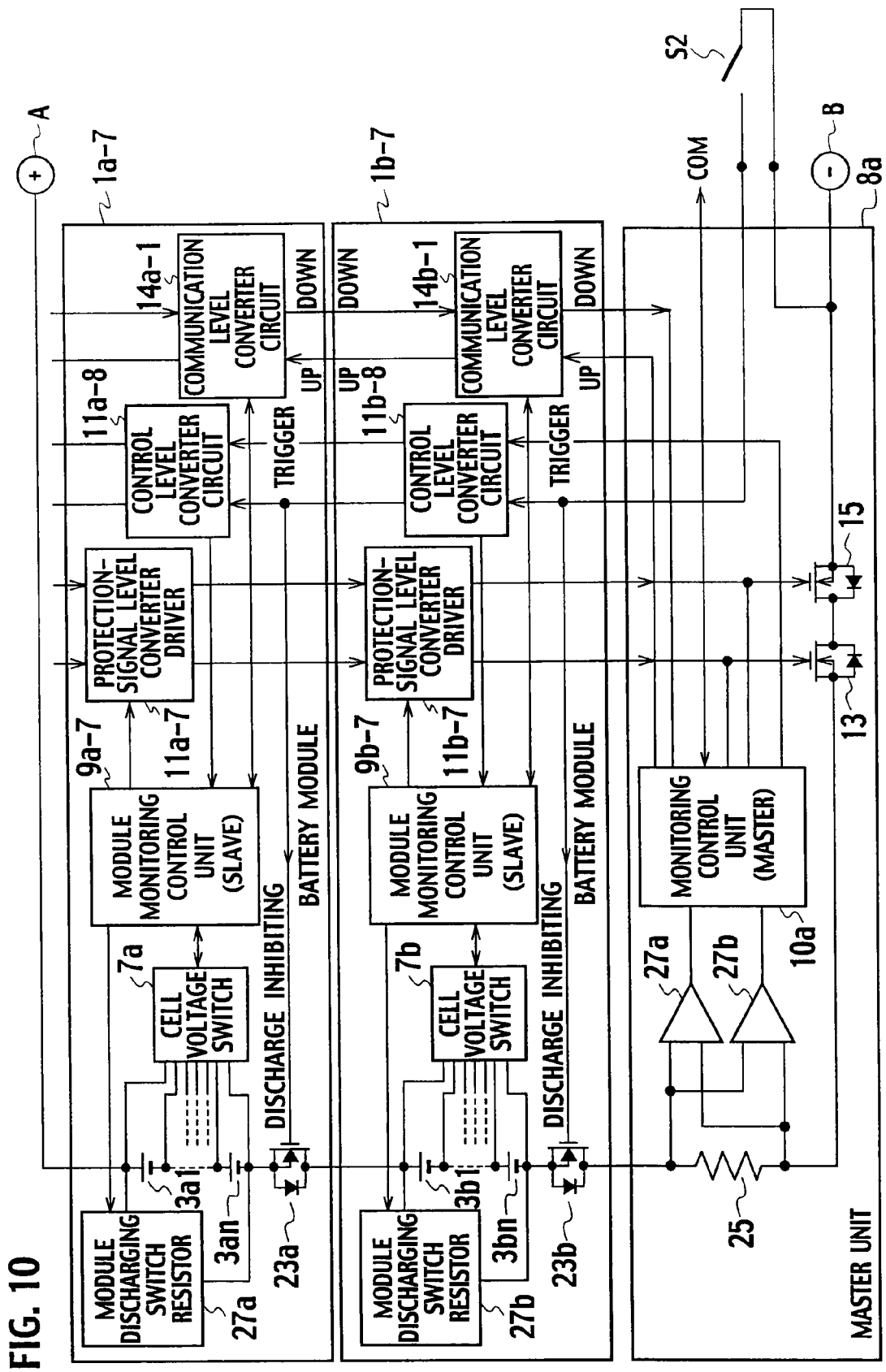
FIG. 10 is a block diagram of a configuration of a battery system according to Embodiment 6 of the present invention.

FIG. 10 is a block diagram of a configuration of a battery system according to Embodiment 6 of the present invention. The battery system shown in FIG. 10 is configured by connecting battery modules 1a-7 and 1b-7, which are connected to each other in series, to a master unit 8a for monitoring and controlling the overall battery system in series.

The battery modules 1a-7 and 1b-7 respectively include: the plural single cells 3a1 to 3an and 3b1 to 3bn connected to one another in series; the cell voltage switches 7a and 7b; module monitoring control units 9a-7 and 9b-7; protection-signal level converter drivers 11a-7 and 11b-7; control level converter circuits 11a-8 and 11b-8; communications level converter circuits 14a-1 and 14b-1; the discharge inhibiting switches 23a and 23b; and module discharging switch resistors 27a and 27b.

The module monitoring control units 9a-7 and 9b-7 include the functions of the module monitoring control units 9a and 9b shown in FIG. 1, and operate as slaves to a monitoring control unit 10a, respectively. The protection-signal level converter drivers 11a-7 and 11b-7 include: a function of inputting a discharge inhibiting input from a high-potential module, and outputting a level-converted discharge inhibiting output to a low-potential module or the master unit 8*a*; and a function of inputting a charge inhibiting input from the high-potential module, and outputting a level-converted charge inhibiting output to the low-potential module or the master unit 8*a*.

The control level converter circuits 11*a*-8 and 11*b*-8 include: a function of inputting a module discharge inhibiting input from the low-potential module or the master unit 8*a*; a function of outputting a level-converted module discharge inhibiting output to the high-potential module; a function of inputting a clock input from the low-potential module or the master unit 8*a*, and outputting a level-converted clock output to the high-potential module; a function of inputting a shutdown input from the low-potential module or the master unit 8*a*, and outputting a level-converted shutdown output to the high-potential module. The communications level converter circuits 14*a*-1 and 14*b*-1 have the same configurations as the communications level converter circuits 14*a* and 14*b* shown in FIG. 9 have, respectively.

The module monitoring control units 9*a*-7 and 9*b*-7 receive clock signals from the control level converter circuits 11*a*-8 and 11*b*-8, and measure the voltages of the single cells in the corresponding modules in synchronism with the clock signals, respectively. The module monitoring control units 9*a*-7 and 9*b*-7 respectively receive shutdown signals from the control level converter circuits 11*a*-8 and 11*b*-8. When the shutdown signals are given thereto, the module monitoring control units 9*a*-7 and 9*b*-7 respectively shut downs the power supplies of the cell voltage switches 7*a* and 7*b* as well as the own module monitoring control units, and the power supplies of the communications level converter circuits 14*a*-1 and 14*b*-1, and thereby reduces their power consumptions. When the shutdown signals are released, the module monitoring control units 9*a*-7 and 9*b*-7 turn on their power supplies, rise, and thus start operations in synchronism with the clock signals, respectively.

The master unit 8*a* has virtually the same configuration as the master unit 8*a* shown in FIG. 9 has. The discharge inhibiting switch 23*b* turns based on a discharge inhibition releasing signal from a discharge inhibition releasing switch S2, and thus releases the plural single cells 3*b*1 to 3*bn* from discharge inhibition. The control level converter circuit 11*b*-8 outputs the discharge inhibition releasing signal, which has come from the discharge inhibition releasing switch S1, to the control level converter circuit 11*a*-8 and the discharge inhibiting switch 23*a* in the battery module 1*a*-7.

Figure 11:
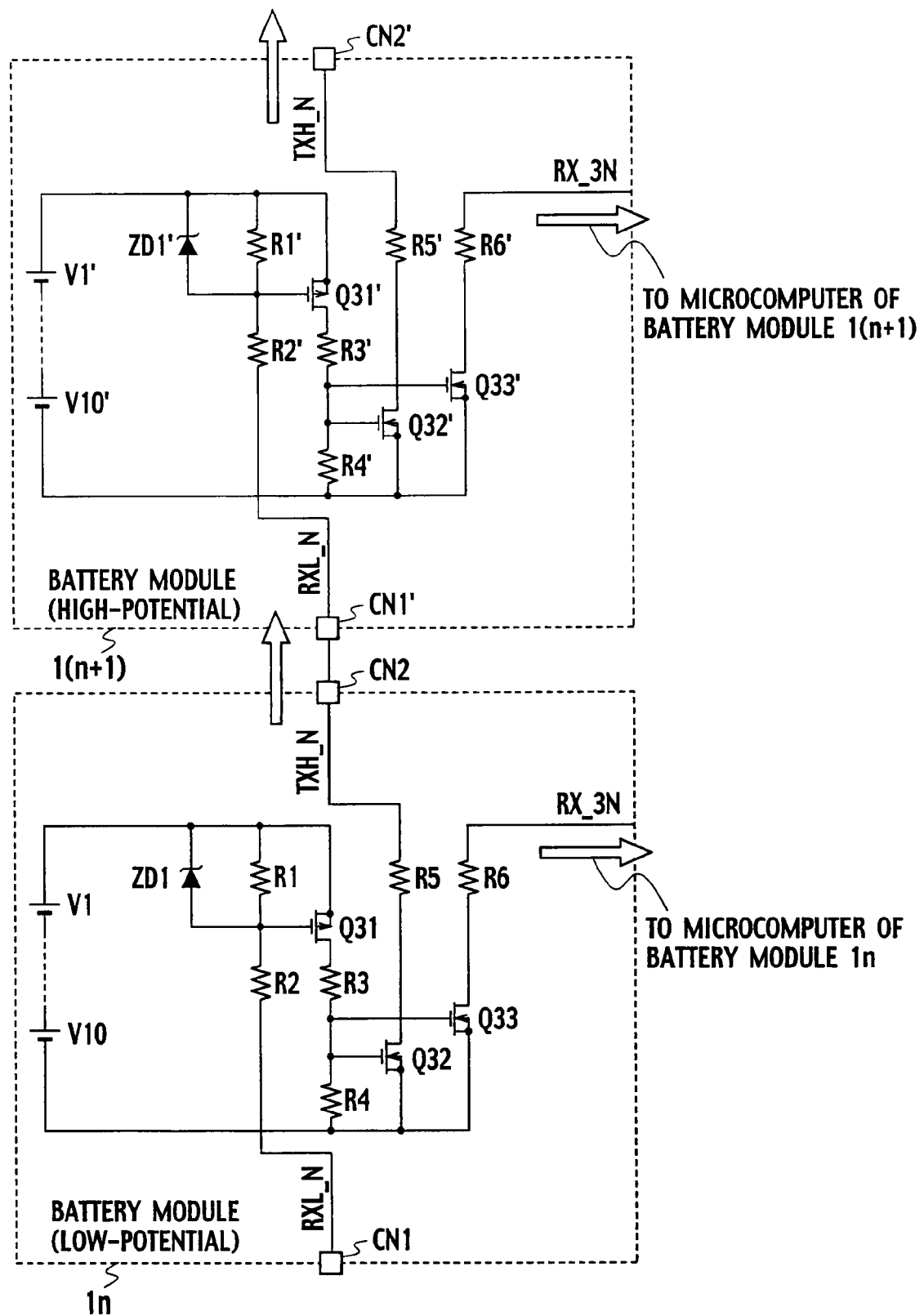
FIG. 11 is a block diagram showing a configuration of communications level converter circuits and control level converter circuits in which a communication is made from a low-potential battery module to a high-potential battery module, and which are provided in the battery system according to Embodiment 6 of the present invention.

FIG. 11 is a block diagram of a configuration of the communications level converter circuits 14*a*-1 and 14*b*-1 as well as the control level converter circuits 11*a*-8 and 11*b*-8 in which a communication is made from a low-potential battery module to a high-potential battery module, and which are provided in the battery system according to Embodiment 6 of the present invention. The converter circuits shown in FIG. 11 cause a communication to be made from a low-potential battery module in to a high-potential battery module 1(n+1).

In the battery module 1*n*, a series circuit including a p-type MOSFET Q31, a resistor R3 and a resistor R4 is connected to the two ends of plural single cells V1 to V10 (corresponding to the plural single cells 3*a*1 to 3*an*), and a parallel circuit including a resistor R1 and a zener diode ZD1 is connected between the gate and drain of the MOSFET Q31. A connector CN1 is connected to the gate of the MOSFET Q31 with a resistor R2 interposed in between. The gate of an n-type MOSFET Q32 and the gate of an n-type MOSFET Q33 are connected to the connecting point between the resistor R3 and the resistor R4. The drain of the MOSFET Q32 is connected to a connector CN1' of the battery module 1(n+1) with a resistor R5 and a connector CN2 interposed in between. The drain of the MOSFET Q33 is connected to a microcomputer (not illustrated) in the battery module 1*n* with a resistor R6 interposed in between. The sources respectively of the MOSFET Q32 and the MOSPET Q33 are connected to a terminal end of the resistor R4. The battery module 1(n+1) has the same configuration as the battery module 1*n* has. The components of the battery module 1(n+1) are denoted by ' (apostrophe) in addition to the same reference numerals as those of the corresponding components in the battery module 1*n* for the purpose of distinguishing the ones from the others.

The battery module 1*n* outputs the signal, which has come from a battery module 1(n−1), to the microcomputer in the battery module 1*n* and to the battery module 1(n+1). The battery module 1(n+1) outputs the signal, which has come from the battery module in, to a microcomputer in the battery module 1(n+1) and to a battery module 1(n+2).

Descriptions will be provided next for how to process the communication between the battery modules shown in FIG. 11. In this case, descriptions will be provided for how the MOSFETs Q31, Q32 and Q33 in the battery module 1*n* operate. MOSFETs Q31' Q32' and Q33' in the battery module 1(n+1) operate in the same manner as the MOSFETs Q31, Q32 and Q33 operate. In addition, a logic for a serial communication input is active low, but inactive before a lower-potential battery module is connected to the battery module 1*n*. First of all, in a case where no signal comes from the lower-potential battery module to the battery module in, or in a case where a signal RXL_N is at the H level (open), all of the MOSFETs Q31, Q32 and Q33 turn off. In other words, in a case where no input signal comes to the battery module in, no current flows in the circuit.

On the other hand, in a case where the signal RXL_N from the lower-potential battery module is connected to the battery module 1*n* while the signal is at the L level (on), all of the MOSFETs Q31, Q32 and Q33 turn on. As a result, a signal TXH_N to a higher-potential battery module and a signal RX_3N to the microcomputer in the battery module 1*n* turn to the L level. This causes the signals to be communicated between the battery modules.

In addition, a series circuit including a resistor R1', a resister R2', the connector CN1', the connector CN2, the resistor R5 and the MOSFET Q32 is connected between the positive electrode of a single cell V1' and the negative electrode of the single cell V10. For this reason, even when the MOSFETs Q31 and Q32 are off, a voltage Vds between the drain and the source of each of the MOSFETs Q31 and Q32 never becomes larger than a voltage double the voltage of the battery module (or the total of the voltages of the single cells V1 to V10). This makes it possible to use devices each with a low breakdown voltage as the MOSFETs Q31 and Q32.

Figure 12:
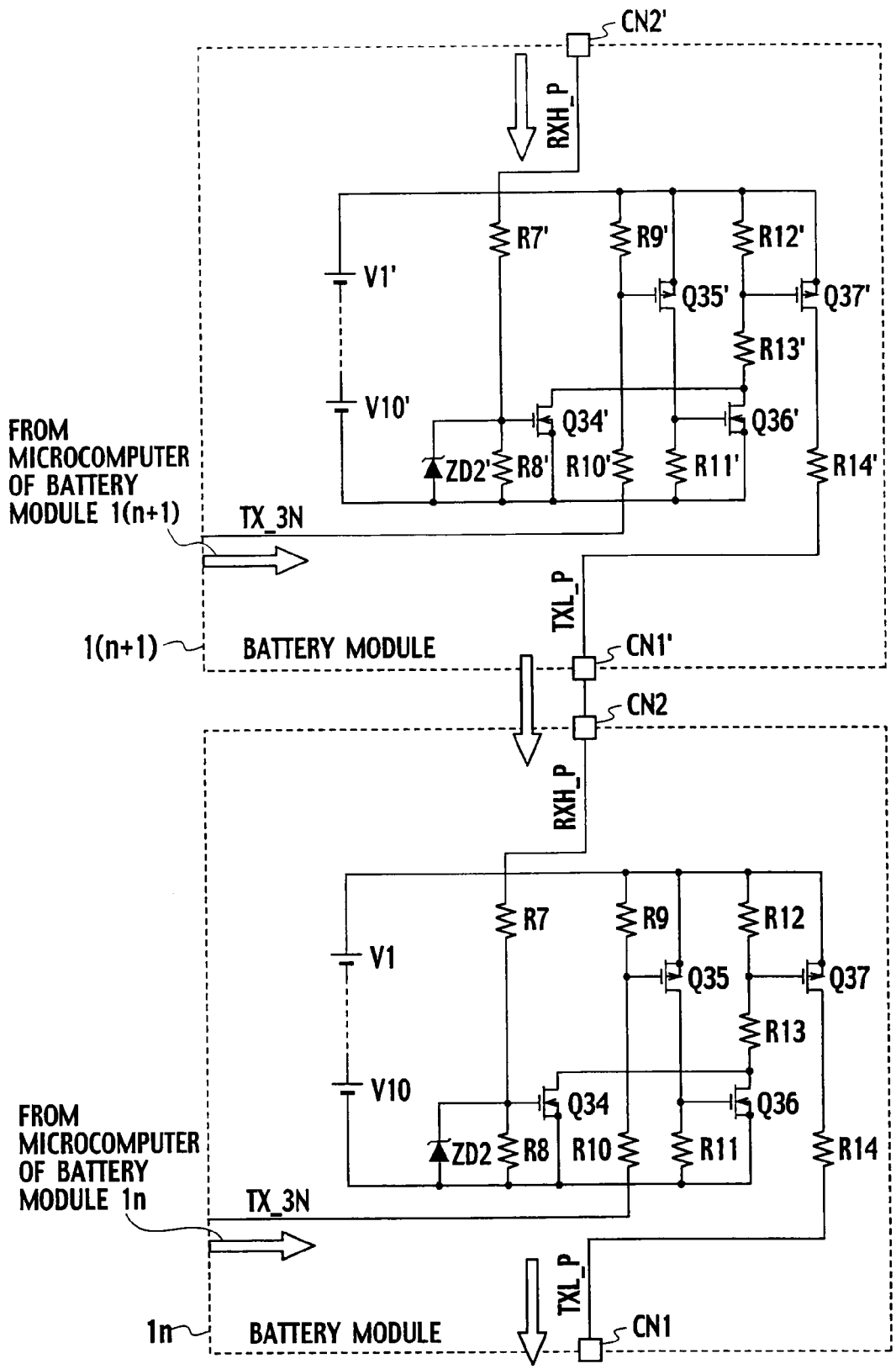
FIG. 12 is a block diagram of a configuration of the communications level converter circuits in which a communication is made from the high-potential battery module to the low-potential battery module, and which are provided in the battery system according to Embodiment 6 of the present invention.

FIG. 12 is a block diagram of a configuration of the communications level converter circuits 14*a*-1 and 14*b*-1 in which a communication is made from the high-potential battery module to the low-potential battery module, and which are provided in the battery system according to Embodiment 6 of the present invention. The converter circuits shown in FIG. 12 cause a communication to be made from the high-potential battery module 1(n+1) to the low-potential battery module 1*n*.

In the battery module 1*n*, a series circuit including a p-type MOSFET Q35 and a resistor R11 is connected to the two ends of the plural single cells V1 to V10, and a series circuit including a resistor R12, a resistor R13 and an n-type MOSFET Q36 is also connected thereto. A resistor R9 is connected between the gate and drain of the MOSFET Q35, and a signal is inputted to the gate of the MOSFET Q35 from the microcomputer (not illustrated) in the battery module 1n via a resistor R10. A series circuit including a resistor R7 and a resistor R8 is connected between the connector CN2 and the negative electrode of the single cell V10, and a zener diode ZD2 is connected between the two ends of the resistor R8. The connecting point between the resistor R7 and the resistor R8 is connected to the gate of a MOSFET Q34. The connecting point between the source of the MOSFET Q35 and the resistor R11 is connected to the gate of the MOSFET Q36, and the drain of the MOSFET Q36 is connected to the drain of the MOSFET Q34. The drain and gate of a MOSFET Q37 are connected to the two ends of the resistor R12, and the source of the MOSFET Q37 is connected to the connector CN1 with a resistor R4 interposed in between. The battery module 1(n+1) has the same configuration as the battery module 1n has. The components of the battery module 1(n+1) are denoted by ' (apostrophe) in addition to the same reference numerals as those of the corresponding components in the battery module 1n for the purpose of distinguishing the ones from the others.

The battery module 1(n+1) outputs an output representing the OR of a signal from the battery module 1(n+2) and a signal from the microcomputer in the battery module 1(n+1) to the battery module 1n. The battery module 1n outputs an output representing the OR of a signal from the battery module 1(n+1) and a signal from the microcomputer in the battery module in to the battery module 1(n−1).

Descriptions will be provided next for how to process a communication between the battery modules shown in FIG. 12. In this case, descriptions will be provided for how the MOSFETs Q34 to Q37 in the battery module 1n operate. MOSFETs Q34' to Q37' in the battery module 1(n+1) operate in the same manner as the MOSFETs Q34 to Q37 operate. In addition, a logic for a serial communication input is active high, but inactive before a higher-potential battery module is connected to the battery module 1n.

First of all, in a case where no signal comes from the higher-potential battery module to the battery module in, or in a case where a signal RXH_P is connected thereto, and in a case where a signal XT_3N from the microcomputer in the battery module 1n is at the H level, all of the MOSFETs Q34 to Q37 turn off. In other words, in a case where no signal comes to the battery module 1n, no current flows in the circuit. Furthermore, in a case where the signal RXH_P from the higher-potential battery module is connected to the battery module 1n while the signal is at the H level, and in a case where a signal from the microcomputer in the battery module 1n is at the H level, the MOSFET Q34 turns on whereas the MOSFETs Q35 and Q36 turns off. As a result, the MOSFET Q37 turns on. Moreover, in a case where no signal from the higher-potential battery module comes to the battery module in, or in a case where the signal RXH_P is not connected to the battery module 1n, and in a case where the signal TX_3N from the microcomputer in the battery module 1n is at the L level, the MOSFET Q34 turns off, and the MOSFETs Q35, Q36 and Q37 turn on. Additionally, in a case where the signal RXH_P from the higher-potential battery module is connected while the signal is at the H level, and in a case where the signal from the microcomputer in the battery module 1n is at the L level, all of the MOSFETs Q34 to Q37 turn on. When the MOSFET Q37 turns on, the signals are communicated between the battery modules.

In addition, a series circuit including the MOSFET Q37' a resistor R14', the connector CN1', the connector CN2, the resistor R7 and the resistor R8 is connected between the positive electrode of the single cell V1' and the negative electrode of the single cell V10. For this reason, even when the MOSFET Q37' is off, the voltage Vds between the drain and the source of the MOSFET Q37' never becomes larger than a voltage double the voltage of the battery module (or the total of the voltages of the single cells V1 to V10). This makes it possible to use a device with a low breakdown voltage as the MOSFET Q37'.

Figure 13:
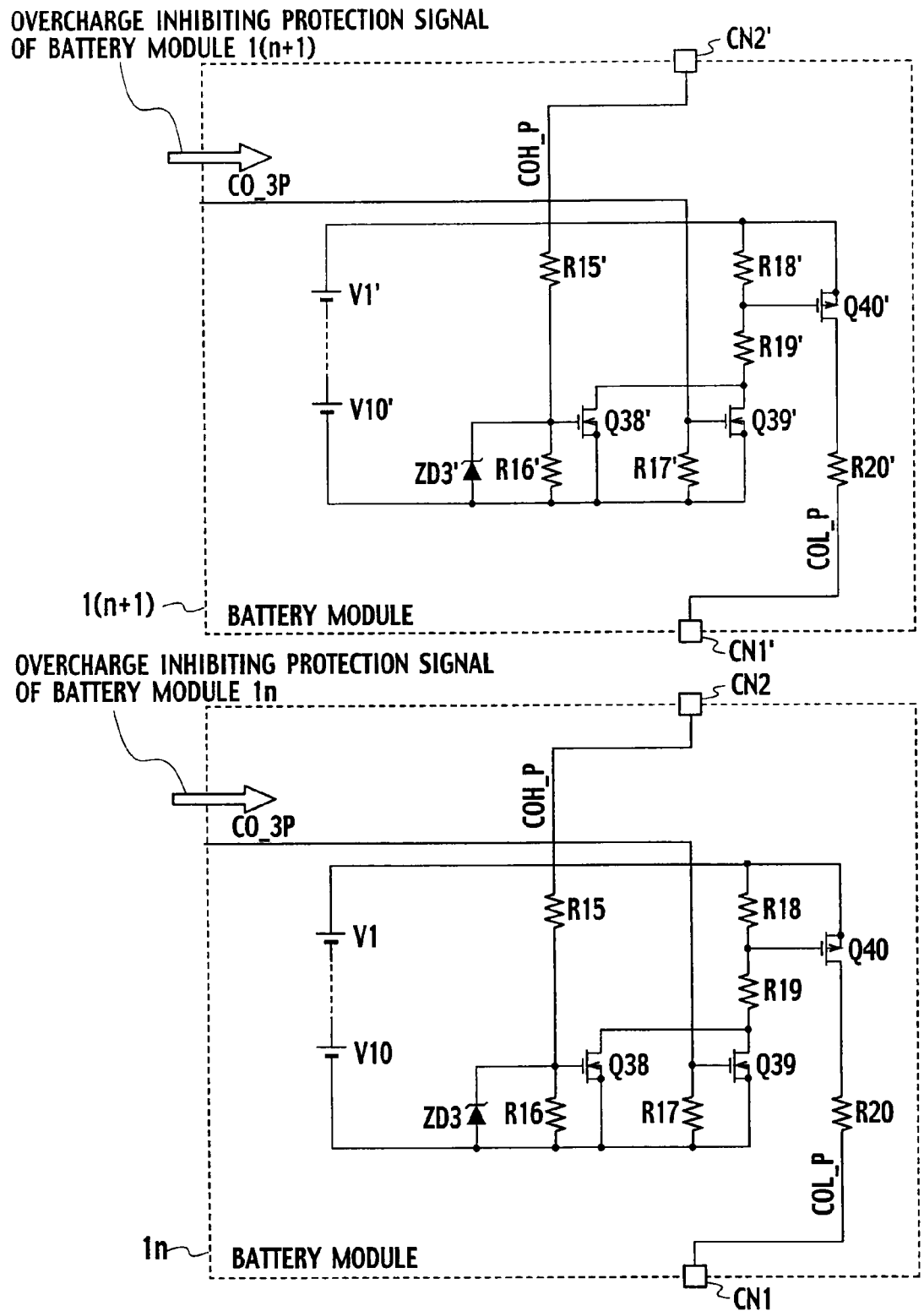
FIG. 13 is a block diagram of a configuration of protection-signal level converter drivers in which an overcharge inhibiting protection signal is communicated between the battery modules in the battery system according to Embodiment 6 of the present invention.

FIG. 13 is a block diagram of a configuration of the protection-signal level converter drivers 11a-7 and 11b-7 in which an overcharge inhibiting protection signal is communicated between the battery modules in the battery system according to Embodiment 6 of the present invention. Each of the converter drivers shown in FIG. 13 outputs, to a low-potential battery module, the OR of an overcharge inhibiting protection signal in the battery module in which the converter driver is included and an overcharge inhibiting protection signal from a high-potential battery module.

In the battery module in, a series circuit including a resistor R18, a resistor R19 and an n-type MOSFET Q39 is connected between the two ends of the plural single cells V1 to V10. A resistor R17 is connected between the source and gate of the MOSFET Q39, and an overcharge inhibiting protection signal in the battery module 1n is inputted to the gate of the MOSFET Q39. A series circuit including a resistor R15 and a resistor R16 is connected between the connecter CN2 and the negative electrode of the single cell V10, and a zener diode ZD3 is connected to the two ends of the resistor R16. The drain of the MOSFET Q39 is connected to the drain of the MOSFET Q38. The gate and drain of a MOSFET Q40 is connected to the two ends of the resistor, respectively, and the source of the MOSFET Q40 is connected to the connector CN1 with a resistor R20 interposed in between. The battery module 1(n+1) has the same configuration as the battery module 1n has. The components of the battery module 1(n+1) are denoted by (apostrophe) in addition to the same reference numerals as those of the corresponding components in the battery module 1n for the purpose of distinguishing the ones from the others.

The battery module 1(n+1) outputs, to the battery module 1n, an output representing the OR of an overcharge inhibiting protection signal from the battery module 1(n+2) and an overcharge inhibiting protection signal in the battery module 1 (n+1). The battery module 1n outputs an output representing the OR of the overcharge inhibiting protection signal from the battery module 1(n+1) and an overcharge inhibiting protection signal in the battery module 1n to the battery module 1(n−1).

Descriptions will be provided next for how to process the communications between the battery modules shown in FIG. 13. In this case, descriptions will be provided for how the MOSFETs Q38 to Q40 in the battery module 1n operate. MOSFETs Q38' to Q40' in the battery module 1(n+1) operate in the same manner as the MOSFETs Q38 to Q40 operate. In addition, the logic of an overcharge inhibiting protection signal input is active high, and non-active before the higher-potential battery module is connected to the battery module 1n.

First of all, in a case where no signal comes from the higher-potential battery module to the battery module in, or in a case where an overcharge inhibiting protection signal COH_P is not connected to the battery module in, and in a case where an overcharge inhibiting protection signal CO_3P in the battery module 1n is at the L level, all of the MOSFETs Q38 to Q40 turn off. In other words, in a case where no signal comes to the battery module in, no current flows in the circuit. In addition, in a case where the overcharge inhibiting protection signal COH_P from the higher-potential battery module is connected to the battery module 1n while the signal is at the H level, the MOSFET Q38 turns on. In a case where the overcharge inhibiting protection signal CO_3P from the battery module 1n is at the H level, the MOSFET Q39 turns on; the internal circuit takes the ORs from the ON of the MOSFET Q38 with the ON of the MOSFET Q39; and thus the MOSFET Q40 turns on. As a result, a signal COL_P to a lower-potential battery module turns to the H level, and thus the signal is transmitted between the battery modules. Furthermore, when the signal CO_3P or the signal COH_P is active, the current flows to the converter driver, and this causes an overcharged cell to discharge. In other words, when an overcharge is detected, an overcharge inhibiting protection signal is transmitted in a direction in which the overcharged cell can discharge.

Moreover, a series circuit including the MOSFET Q40', a resistor R20', the connector CN1', the connector CN2, the resistor R15 and the resistor R16 is connected between the positive electrode of the single cell V1' and the negative electrode of the single cell V10. As a result, even when the MOSFET Q40' is off, the voltage Vds between the drain and source of the MOSFET Q40' never becomes larger than a voltage double the voltage of the battery module (the total of the voltages of the single cells V1 to V10). This makes it possible to use a device with a low breakdown voltage as the MOSFET Q40'.

Figure 14:
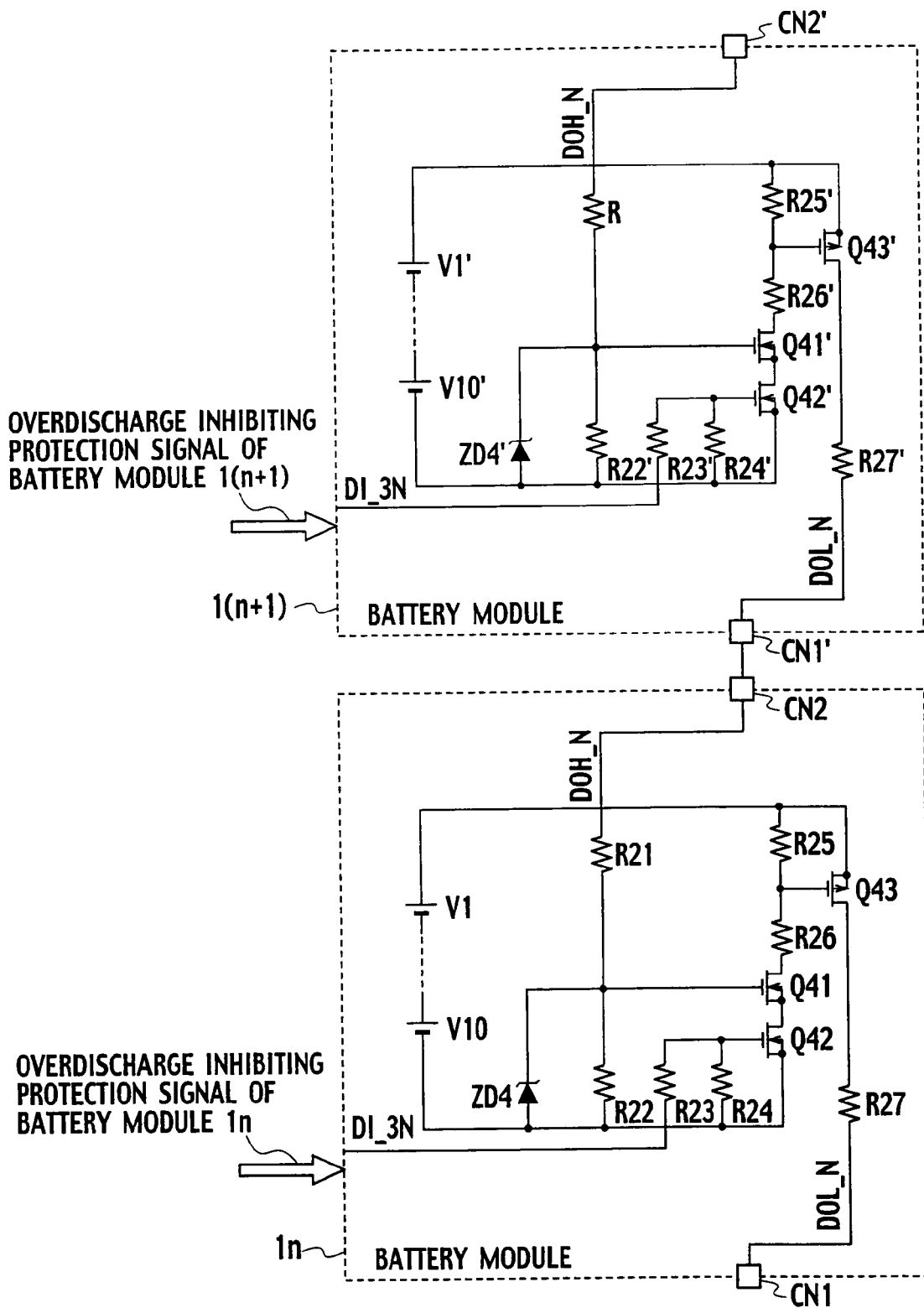
FIG. 14 is a block diagram a configuration of the protection-signal level converter drivers in which an overdischarge inhibiting protection signal is communicated between the battery modules in the battery system according to Embodiment 6 of the present invention.

FIG. 14 is a block diagram a configuration of the protection-signal level converter drivers in which an overdischarge inhibiting protection signal is communicated between the battery modules in the battery system according to Embodiment 6 of the present invention. Each of the converter drivers shown in FIG. 14 outputs, to a lower-potential battery module, the OR of an overdischarge inhibiting protection signal in a battery module in which the converter driver is included and an overdischarge inhibiting protection signal from a higher-potential battery module.

In the battery module 1n, a series circuit including a resistor R25, a resistor R26, an n-type MOSFET Q41 and an n-type MOSFET Q42 is connected to the two ends of the plural single cells V1 to V10. A resistor R24 is connected between the gate and source of the MOSFET Q42, and an overdischarge inhibiting protection signal from the battery module 1n is inputted to the gate of the MOSFET Q42. A series circuit including a resistor R21 and a resistor R22 is connected between the connector CN2 and the negative electrode of the single cell V10, and the gate of the MOSFET Q41 is connected to the connecting point between the resistor R21 and the resistor R22. A zener diode ZD4 is connected between the two ends of the resistor R22. The drain and gate of a MOSFET Q43 are connected to the two ends of the resistor R25, respectively. The source of the MOSFET Q43 is connected to the connector CN1 with a resistor R27 interposed in between. The battery module 1(n+1) has the same configuration as the battery module 1n has. The battery module 1(n+1) has the same configuration as the battery module 1n. The components of the battery module 1(n+1) are denoted by ' (apostrophe) in addition to the same reference numerals as those of the corresponding components in the battery module 1n for the purpose of distinguishing the ones from the others.

The battery module 1(n+1) outputs, to the batter module in, an output representing the OR of an overdischarge inhibiting protection signal from a battery module 1(n+2) and an overdischarge inhibiting protection signal from the battery module 1(n+1). The battery module 1n outputs, to the battery module 1(n−1), an output representing the OR of the overdischarge inhibiting protection signal from the battery module 1(n+1) and an overdischarge inhibiting protection signal from the battery module 1n.

Descriptions will be provided next for how to process the communications between the battery modules shown in FIG. 14. In this case, descriptions will be provided for how the MOSFETs Q41 to Q43 in the battery module 1n operate. MOSFETs Q41' to Q43' in the battery module 1(n+1) operate in the same manner as the MOSFET Q41 to Q43 operate. In addition, the logic of an overdischarge inhibiting protection signal input is active low, and active before a higher-potential battery module is connected to the battery module 1n.

First of all, in a case where no signal comes from the higher-potential battery module to the battery module in, or in a case where an overdischarge inhibiting protection signal DOH_N is not connected to the battery module 1n at the H level, and in a case where an overcharge inhibiting protection signal DI_3N from the battery module 1n is at the H level, all of the MOSFET Q41 to Q43 turn on. In other words, in a case where no overdischarge inhibiting protection signal comes to the battery module in, a current flows in the circuit. Furthermore, in a case where the overdischarge inhibiting protection signal DOH_N from the higher-potential battery module is at the L level or open, and in a case where the overdischarge inhibiting protection signal DI_3N from the battery module 1n is at the H level, the MOSFET Q41 turns off; the MOSFET Q42 turns on; and the MOSFET Q43 turns off. Moreover, in a case where the overdischarge inhibiting protection signal DOH_N from the higher-potential battery module is at the H level, and in a case where the overdischarge inhibiting protection signal DI_3N from the battery module 1n is at the L level, the MOSFET Q41 turns on, and the MOSFET Q42 and MOSFET Q43 turn off. Additionally, in a case where the overdischarge inhibiting protection signal DOH_N from the higher-potential battery module is at the L level, and in a case where the overdischarge inhibiting protection signal DI_3N from the battery module 1n is at the L level, all of the MOSFETs Q41 to Q43 turn off.

In addition, a series circuit including the MOSFET Q43' a resistor R27', the connector CN1', the connector CN2, the resistor R21 and the resistor R22 is connected between the positive electrode of the single cell V1' and the negative electrode of the single cell V10. As a result, even when the MOSFET Q43' is off, the voltage Vds between the drain and source of the MOSFET Q43' never becomes larger than a voltage double the voltage in the battery module (the total of the voltages of the single cells V1 to V10). This makes it possible to use a device with a low breakdown voltage as the MOSFET Q43'.

Furthermore, normally, the MOSFETs Q41 to Q43 turn on, and thus the current flows to the converter driver. By contrast, when an overdischarge is detected, the MOSFETs Q41 to Q43 turn off, and thus no power is consumed. This makes it possible to inhibit the overdischarging cell from discharging.

It should be noted that the present invention shall not be limited to the battery systems according to Embodiments 1 to 6. In the case of each of the battery systems according to Embodiments 1 to 6, one or more single cells in each of the battery modules are connected to one another in series. Nevertheless, one or more single cells may be connected to one another in parallel, for example. Otherwise, one or more single cells may be connected to one another in series-parallel.

INDUSTRIAL APPLICABILITY

The battery system according to the present invention can be employed, for example, to batteries of electric automobiles, hybrid cars, and the like.

The invention claimed is:

1. A battery module comprising:
one or more single cells;
a voltage detection unit that detects voltages respectively of the one or more single cells;
a module monitoring control unit that outputs a signal when each voltage detected by the voltage detection unit becomes equal to a predetermined value; and
a communications circuit through which the battery module communicates with a different battery module,
wherein the communications circuit comprises:
a first series circuit including a first resistor and a second resistor, one end of the first series circuit being connected to a signal input terminal, an opposite end of the first series circuit being connected to a negative electrode of the single cell whose potential is the lowest in the battery module including the communications circuit;
a first switch element configured to turn on when a signal of the different battery module is input into a first control terminal from the signal input terminal through the first resistor;
a second switch element configured to turn on when the signal of the battery module including the communications circuit is input into a second control terminal; and
a second series circuit including a third switch element and a third resistor, the third switch element configured to output a logical sum of the signal of the different battery module, which is output from the first switch element, and the signal of the battery module including the communications circuit, which is output from the second switch element,
wherein one end of the second series circuit is connected to a positive electrode of the single cell whose potential is the highest in the battery module including the communications circuit, and an opposite end of the second series circuit is connected to the signal input terminal of the different battery module.

2. A battery module comprising:
one or more single cells;
a voltage detection unit that detects voltages respectively of the one or more single cells;
a module monitoring control unit that outputs a protection signal for overcharge inhibition when any one of the voltages detected by the voltage detection unit becomes equal to an upper limit value; and
transmitting means configured to transmit the protection signal to inhibiting means which is connected to the battery module in series and which is configured to inhibit the one or more single cells from being overcharged based on the protection signal,
wherein the transmitting means comprises:
a first series circuit including a first resistor and a second resistor, one end of the first series circuit being connected to a signal input terminal, an opposite end of the first series circuit being connected to a negative electrode of the single cell whose potential is the lowest in the battery module including the transmitting means;
a first switch element configured to turn on when a protection signal of a different battery module is input into a first control terminal from the signal input terminal through the first resistor;
a second switch element configured to turn on when the protection signal of the battery module including the transmitting means is input into a second control terminal; and
a second series circuit including a third switch element and a third resistor, the third switch element configured to output a logical sum of the protection signal of the different battery module, which is output from the first switch element, and the protection signal of the battery module including the transmitting means, which is output from the second switch element,
wherein one end of the second series circuit is connected to a positive electrode of the single cell whose potential is the highest in the battery module including the transmitting means, and an opposite end of the second series circuit is connected to the signal input terminal of the different battery module.

3. A battery module comprising:
one or more single cells;
a voltage detection unit that detects voltages respectively of the one or more single cells;
a module monitoring control unit that outputs a protection signal for overdischarge inhibition when any one of the voltages detected by the voltage detection unit becomes equal to a lower limit value; and
transmitting means configured to transmit the protection signal to inhibiting means which is connected to the battery module in series and which is configured to inhibit the one or more single cells from being overdischarged based on the protection signal,
wherein the transmitting means comprises:
a first series circuit including a first resistor and a second resistor, one end of the first series circuit being connected to a signal input terminal, an opposite end of the first series circuit being connected to a negative electrode of the single cell whose potential is the lowest in the battery module including the transmitting means;
a first switch element configured to turn on when no protection signal of the different battery module is input into a first control terminal from the signal input terminal through the first resistor;
a second switch element configured to turn on when no protection signal of the battery module including the transmitting means is input into a second control terminal; and
a second series circuit including a third switch element and a third resistor, the third switch element configured to output a logical sum of a protection signal of the different battery module, which is output from the first switch element, and the protection signal of the battery module including the transmitting means, which is output from the second switch element,
wherein one end of the second series circuit is connected to a positive electrode of the single cell whose potential is the highest in the battery module including the transmitting means, and an opposite end of the second series circuit is connected to the signal input terminal of the different battery module.

4. A battery module comprising:
one or more single cells;
a voltage detection unit for detecting voltages respectively of the one or more single cells;
a monitoring control unit for outputting voltage data of the voltages detected by the voltage detection unit and outputting to a unit for cutting off a signal for cutting off a power line when the voltage data becomes equal to a predetermined value; and
transmitting means including a first connector and a second connector which differs from the first connector and configured to transmit and receive the voltage data between a first different battery module and a second different battery module and the battery module including the transmitting means through the first connector and the second connector;

wherein the transmitting means comprises:

a first resistor configured to connect one end of the first resistor with positive electrodes of the one or more single cells;

a second resistor configured to connect one end of the second resistor with opposite end of the first resistor, to input the voltage data from the first connector to an opposite end of the second resistor;

a first switch element configured to connect a drain of the first switch element with positive electrodes of the one or more single cells, to connect a gate of the first switch element with a line which the first resistor and the second resistor are connected, and to turn on when the voltage data from the first connector is inputted into the gate of the first switch element through the second resistor;

a third resistor configured to connect one end of the third resistor with a source of the first switch element, to connect an opposite end of the third resistor with negative electrodes of the one or more single cells;

a fourth resistor configured to connect one end of the fourth resistor with the second connector; and a second switch element configured to connect a gate of the second switch element with one end of the third resistor, to connect a source of the second switch element with the negative electrodes of the one or more single cells, to connect a drain of the second switch element with an opposite end of the fourth resistor, and to output to the second connector the voltage data from the first connector through the fourth resistor by turning on when the first switch element turns on.

* * * * *